(12) United States Patent
Wang et al.

(10) Patent No.: US 7,200,799 B2
(45) Date of Patent: Apr. 3, 2007

(54) AREA EFFICIENT PARALLEL TURBO DECODING

(75) Inventors: Zhongfeng Wang, San Jose, CA (US); Keshab K. Parhi, Mission Viejo, CA (US)

(73) Assignee: Regents of the University of Minnesota, Minneapolis, MN (US)

( * ) Notice: Subject to any disclaimer, the term of this patent is extended or adjusted under 35 U.S.C. 154(b) by 262 days.

(21) Appl. No.: 10/134,684

(22) Filed: Apr. 30, 2002

(65) Prior Publication Data

US 2002/0174401 A1 Nov. 21, 2002

Related U.S. Application Data

(60) Provisional application No. 60/286,962, filed on Apr. 30, 2001.

(51) Int. Cl.
*H03M 13/03* (2006.01)
(52) U.S. Cl. ............... 714/795; 714/794; 714/796
(58) Field of Classification Search ............... 714/795, 714/794, 796
See application file for complete search history.

(56) References Cited

U.S. PATENT DOCUMENTS

| | | | |
|---|---|---|---|
| 6,484,283 B2* | 11/2002 | Stephen et al. | 714/786 |
| 2001/0052104 A1 | 12/2001 | Xu et al. | |
| 2001/0054170 A1* | 12/2001 | Chass et al. | 714/796 |

OTHER PUBLICATIONS

Jah-Ming Hsu; Chin-Liang Wang; A parallel decoding scheme for turbo codes, Proceedings of the 1998 IEEE International Symposium on Circuits and Systems, vol. 4, May 31-Jun. 3, 1998, pp. 445-448.*

Lutz Papke and Patrick Robertson, "Improved decoding with SOVA in a parallel concatenated (Turbo-code) scheme," pp. 102-106, IEEE Int'l conference on comm. (ICC) 1996.

L. Lin and R.S. Cheng, "Improvements in SOVA-Based Decoding for Turbo codes," pp. 1473-1478, ICC 1997.

Zhongfeng Wang, Hiroshi Suzuki and Keshab K. Parhi, "Efficient Approaches to Improving Performance of Vlsi Sova-Based Turbo Decoders," pp. I-287-90, ISCAS 2000-IEEE International Symposium on Circuits and Systems, May 30, 2000.

Hiroshi Suzuki, Zhongfeng Wang and Keshab K. Parhi, "A K=3, 2Mbps Low Power Turbo Decoder for $3^{rd}$ Generation W-CDMA Systems," Proceeding of the IEEE Custom Integrated Circuit Conference, Apr. 2000.

Zhongfeng Wang, Hiroshi Suzuki and Keshan K. Parhi, "VLSI Implementation Issues of Turbo Decoder Design for Wireless Applications," IEEE Workshop on Signal Processing Systems Design and Implementation, Oct. 1999.

(Continued)

*Primary Examiner*—Joseph D. Torres
(74) *Attorney, Agent, or Firm*—Fish & Richardson P.C.

(57) ABSTRACT

Turbo decoders may have large decoding latency and low throughput due to iterative decoding. One way to increase the throughput and reduce the latency of turbo decoders is to use high speed decoding schemes. In particular, area-efficient parallel decoding schemes may be used to overcome the decoding latency and throughput associated with turbo decoders. In addition, hybrid parallel decoding schemes may be used in high-level parallelism implementations. Moreover, the area-efficient parallel decoding schemes introduce little or no performance degradation.

16 Claims, 15 Drawing Sheets

OTHER PUBLICATIONS

Jah-Ming Hsu and Chin-Liang Wang, "A Parallel Decoding Scheme for Turbo Codes," pp. IV-445-448, IEEE Mar. 1998.

Andrew J. Viterbi, An Intuitive Justification and a Simplified Implementation of the MAP Decoder for Convolutional Codes, Feb. 1998.

Xu et al., *VLSI design and implementation of WCDMA channel decoder*, IEEE, Electrical and Computer Engineering, Canadian Conference, May 13-16, 2001, pp. 241-245, vol. 1.

Halter et al., *Reconfigurable signal processor for channel coding and decoding in low SNR wireless communications*, IEEE, Signal Processing Systems, 1998.

Hong et al., *VLSI circuit complexity and decoding performance analysis for low-power RSC turbo-code and iterative block decoders design*, Military Communications Conference, IEEE, Oct. 18-21, 1998, pp. 708-712, vol. 3.

Beerel et al., *An O(log.sub 2/N)-latency SISO with application to broadband turbo decoding*, IEEE. MILCOM 2000, 21st Century Military, Communications Conference Proceedings, Oct. 22-25, 2000, pp. 194-201, vol. 1.

Xuan et al., *Design and analysis of turbo decoder for Chinese third generation mobile communication system*, IEEE, Electronics, Circuits and Systems, Dec. 17-20, 2000, pp. 680-683, vol. 2.

Yan et al., *A low power VLSI architecture of SOVA-based turbo-code decoder using scarce state transition scheme*, IEEE, Circuits and Systems, May 28-31, 2000, pp. 283-286, vol. 1.

Beerel et al., *A low latency SISO with application to broadband turbo decoding*, IEEE, Selected Areas in Communications, May 2001, pp. 860-870.

\* cited by examiner

AREA EFFICIENT PARALLEL TURBO DECODING

This application claims priority from U.S. Provisional Application No. 60/286,962, filed Apr. 30, 2001, titled "Turbo Decoding and Decoders," by Zhongfeng Wang and Keshab Parhi, the entire disclosure of which is incorporated herein by reference.

The U.S. Government has a paid-up license in this invention and the right in limited circumstances to license others on reasonable terms as provided for by the terms of contract number DA/DABT63-96-C-0050 awarded by the Defense Advanced Research Project Agency.

TECHNICAL FIELD

This invention relates generally to turbo codes and in particular to area-efficient parallel turbo decoding schemes and decoders.

BACKGROUND

In communications systems, signals transmitted, wirelessly for example, may be subjected to fading, jamming, and other elements that may cause errors to be introduced in the signal. The coding of signals before transmission helps to overcome the effects of channel noise, fading, and jamming, by allowing errors introduced during the transmission to be detected and corrected when the signal is decoded at a receiver.

Parallel concatenated convolution codes (PCCC) or "Turbo codes" have been recognized as a breakthrough in coding schemes. Turbo codes provide powerful resistance to errors generated during transmission. Turbo codes provide high coding gains and bit error rates as low as $10^{-7}$. Because turbo codes provide outstanding error correction, turbo codes are very useful in applications where the signal-to-noise ratio (SNR) is generally low (e.g., wireless communications).

A turbo encoder may include a parallel concatenation of two recursive systematic convolutional (RSC) encoders linked by an interleaver. The two RSC encoders provide the component codes of a turbo code. The interleaver changes the order of the data stream before it is input to the second RSC encoder. Because one data stream is interleaved, the resulting codes have time-variant characteristics that provide for the high coding gains obtained from turbo coders.

A serial turbo decoder may include a pair of soft-input, soft output (SISO) decoders, a receiver buffer, an interleaver, and a deinterleaver. In operation, an incoming block of data (also called a data frame) is processed once and then recirculated several times to achieve a desired coding gain. Although turbo codes exhibit high resistance to errors, they are not ideally suited for many practical applications because of an inordinately high latency that is a result of the turbo encoder's use of interleavers (which introduce delay) and the turbo decoder's iterative algorithm which is computationally complex. Turbo codes usually work with large block sizes (e.g. N>5000 bits). The soft inputs for an entire block must be stored in a memory in order to facilitate the iterative decoding. In other words, the soft inputs will be repetitively used in each decoding phase. As a result, turbo decoders are memory intensive, which may render them impractical or too expensive for many applications.

In general, latency of serial turbo decoders may be marginally improved by using specially designed high-speed hardware to implement the turbo decoders; however, only incremental improvement in latency is provided at the cost of increased expense and device complexity, in addition to increased power dissipation (which may be unacceptable in many low power wireless devices).

An alternative approach to overcoming the high latency of turbo decoding is to use parallel decoding architectures. Parallel decoding can greatly improve throughput and latency. Two basic parallel schemes are available. Parallelism may be achieved by decoding multiple received signals at the same time or by dividing a received signal into blocks and decoding the blocks in parallel. While throughput and latency may be reduced using parallel decoding, the large memory requirement is not. In addition, hardware complexity and cost also are increased. Therefore, parallel schemes that are memory efficient and hardware (or area) efficient are needed for practical implementation of turbo codes.

An example of a communications system 100 of the type shown in FIG. 1. As is conventional, the communications system 100 includes a transmitter 101 that may be used to send signals to a receiver 102 through a transmission medium including a communications channel 105. In transmitter 101, a source encoder 111 removes redundant parts of a signal for transmission. An encryptor 113 may be used to encrypt the signal ensuring privacy of the information transmitted in the signal. The encrypted signal 114 is provided to the turbo encoder 115, discussed previously, which encodes the signal to protect against perturbations introduced by the communications channel 105. The encoded signal 116 is supplied as an input to modulator 117. The modulator 117 modulates the encoded signal for suitable transmission across the channel 105.

In the receiver 102, a demodulator 122 demodulates the signal received from the channel 105. The demodulated signal is provided to the turbo decoder 124, discussed previously. The turbo decoder 124 decodes the signal, checks the signal for errors during transmission, and corrects for errors if possible. The decoded signal may be sent to a decryptor 126 if the signal is encrypted. Finally, the signal is decoded by a source decoder 128.

An exemplary conventional encoder, shown in FIG. 2A, may be used to implement the encoder 115 shown in FIG. 1. The turbo encoder 115 may include two recursive systematic convolutional (RSC) encoders 201, 203, and an interleaver 205. The interleaver 205 may be implemented using a conventional block interleaver or a random inter-leaver. The interleaver works on block-based data. Once a block of data is received in sequence, the interleaver outputs the data in a perturbed order. The inter-leaver 205 changes the order of the data stream 114 or $u_k$ before it is input to the second RSC 203. Because one data stream is interleaved, the resulting codes have time-variant characteristics that provide for the high coding gains obtained from turbo coders.

The turbo encoder 115 receives input signal 114 $u_k$. The systematic bit $x_k^s$ at time k is one output of the encoder. The RSC encoder 201 encodes bits in the signal $u_k$ in an original order. The second RSC encoder 203 encodes an interleaved information sequence received from interleaver 205. For each bit $x_k^s$ at time index k, the first RSC encoder 201 generates parity bit $x_k^{p1}$ and the second RSC encoder 203 generates parity bit $x_k^{p2}$. Parity bits $x_k^{p1}$ and $x_k^{p2}$ may be punctured (i.e., deleted from the output data stream) before sending to the modulator 117 according to a desired coding rate. The outputs $x_k^s$, $x_k^{p1}$, and $x_k^{p2}$ form the output 116 to the modulator 117. The output bits are then transmitted over a communication channel using a variety of transmission techniques as described in "Digital Communications," by John Proakis, McGraw-Hill, 1983, ISBN 0-07-050937-9.

The turbo decoder 124 of FIG. 1 may be implemented using a conventional serial turbo decoder 124 shown in FIG. 2B. Signal 123 input to turbo decoder 124 may include bits $y_k^s$, $y_k^{p1}$, and $y_k^{p2}$, which correspond to bits $x_k^s$, $x_k^{p1}$, and $x^{ip2}$ produced by turbo encoder 115 (see FIG. 2A). The turbo decoder 124 includes two soft-input soft-output (SISO) decoders 221, 222, two interleavers 231, 233, and one deinterleaver 240. Each decoder 221 and 222 has two outputs at each time instant: (1) extrinsic information, denoted as $L_{ex}^i(k)$ where k represents the time and i corresponds to the first or second SISO decoder, (2) log likelihood ratio (LLR), denoted as $L_{i_r}^i(k)$ or $L_R^i(k)$. The extrinsic information output from one constituent decoder is used as a priori information for the other constituent decoder after interleaving/de-interleaving. The MAP algorithm may be used to compute the soft outputs. The decision bits ($u_k$=+1 or $u_k$=−1) are determined depending on the signs of the LLR values.

A maximum a-posteriori (MAP) algorithm may be used to implement the SISO decoders 221 and 222 in turbo decoder 124. A detailed discussion of the MAP algorithm and its derivation may be found in "Near optimum error correcting coding and decoding: turbo codes" by C. Berrou et al., IEEE Tran. on Communications, vol. 44, pp. 1261–1271, October 1996 and "A comparison of optimal and sub-optimal MAP decoding algorithms operating in the log domain" by P. Robertson et al., IEEE Int. Conf. on Communications, pp. 1009–1013, 1995.

If $R_1^N=(R_1, R_2, \ldots, R_k, \ldots, R_N)$ denotes a received noise corrupted signal and $S_k$ denotes the state of the encoder at time k, respectively, using Bayes rule (and taking into account events after time k are not influenced by observation of $R_1^k$ and bit $u_k$), if state $S_k$ is known, LLR of $u_k$ can be derived as $$L_R(u_k) = \log \frac{\sum_m \sum_{m'} \alpha_{k-1}(m') \cdot \beta_k(m) \cdot \gamma_1(y_k, m, m')}{\sum_m \sum_{m'} \alpha_{k-1}(m') \cdot \beta_k(m) \cdot \gamma_0(y_k, m, m')} \quad (1)$$

where the forward recursion metric $\alpha$, the backward recursion metric $\beta$ and the branch metric $\gamma_i$ are defined as $$\alpha_k(m) = P(S_k = m | R_1^k) \quad (2)$$

$$\beta_k(m) = \frac{P(R_{k+1}^N | S_k = m)}{P(R_{k+1}^N | R_1^k)} \quad (3)$$

$$\gamma_i(R_k, m, m') = P(u_k = i, S_k = m, R_k | S_{k-1} = m') \quad (4)$$

respectively.

In prior applications of the MAP algorithm to turbo decoding, a frame of received data is decoded by first calculating the forward recursion metrics (x across the entire frame of data. The results for each of the forward recursion metric $\alpha$ computations are saved in a memory. After completing the forward recursion metric $\alpha$ computations, the backward recursion metrics $\beta$ are computed beginning at the end of the data-frame. After each backward recursion metric $\beta$ calculation is completed an LLR computation may be performed using the corresponding saved forward recursion metric $\alpha$. This direct implementation of the MAP algorithm is referred to as the global recursion approach.

A drawback of using the MAP algorithm is that a large amount of memory is required to decode a block of data (i.e., a frame) since all of the forward recursion metrics $\alpha$ are stored from the starting trellis stage (i.e., the beginning of the data block) to the end trellis stage (i.e., the end of the data block) when the backward recursion metrics $\beta$ recursive computation begins. In addition, another drawback is the resulting long decoding delay (or latency) since LLR calculations cannot be made until the first backward recursion metric $\beta$ has been determined. For example, according to the global recursion approach if a 4-state turbo code of frame length (N)=1024 bits, having a finite word length of 9 bits used to represent each state metric, the storage necessary to decode an entire frame would be a total of 4×1024×9=36,864 bits.

One known technique to reduce latency and the memory requirements associated with the global recursion approach is the sliding window approach. The sliding window approach initializes each state as equi-probable. The recursion operations are continued for a number of trellis stages. As a result, the state metrics at the last time index may be assumed to be reliable.

The sliding window approach may be implemented using different versions. As shown in FIG. 3, one version includes a timing diagram for the sliding window approach is shown for decoding a data-block or frame 300. The data block or frame 300 includes a number of sliding windows or sub-blocks of data (e.g., 301, 302, 303, 304, 305, 306, 307, 308, 309, and 310). The sliding window length is normally chosen to be 5 to 7 times the constraint length (e.g., the memory size plus one) of RSC encoders. In this example, two backward recursion units (performing a pre-computation backward recursion metric β1 computation 310 and backward recursion metric β2 computation 312) and one forward recursion unit α (performing a forward recursion metric computation 313) are employed for computing the state metrics. It may be assumed that the first two time slots (2 $T_{sw}$) are used for computing the branch metrics for the first two sliding windows, where the time slot $T_{sw}$ denotes the processing time for a sliding window within one decoding phase. It also may be assumed that the trellis starts and ends on the same known state, such as, for example, State 0.

At the beginning of the third time slot t3 330, the α unit starts forward recursive computation 313 on the first sliding window 301. The pre-computation β1 unit starts backward recursive computation 310 on the second sliding window 302 with a constant initial value assigned to all states. The branch metrics are computed for the 3$^{rd}$ sliding window in the meantime. By the end of the period t3, the computed forward state metrics are stored in a small buffer and will be used for computation of LLR/Lex in the next time slot. The pre-computation backward state metrics at the last time index within a time slot are used as the initial values for the computation of the backward state metrics in the next time slot.

During the fourth time slot t4 335, the backward recursion metric β2 unit starts its backward recursion computation 312 with the initial values from the pre-computation backward recursion metrics determined during t3. At each decoding cycle (or time period), the previously saved forward state metrics at time index k−1 and presently computed backward state metrics at time index k are used for computation of the outputs LLR and extrinsic information Lex at time index k. During the fourth time slot 335, the LLR and extrinsic information are computed for the bits in the first sliding window 301. In the meantime, the α unit continues its forward recursion computations 313 with the initial values equal to the forward state metric at the last time index. This process is repeated until the end of a frame 300 is reached.

If it is assumed that there is a total of S sliding windows in a frame, at the (S+3)-rdT$_{sw}$, the β2 unit starts its backward recursion from the ending stage. The outputs LLR and extrinsic information of the bits in the last sliding window 310 are output during this time period.

Using the sliding window approach, only the forward state metrics within one sliding window need to be stored. This represents a dramatic savings in memory over the global recursion approach which requires that the entire state metrics must be stored out to the last sub-block at which point backward recursion computations begin.

The sliding window length may be chosen to be 5 to 7 times of the constraint length (K) of the code. For example, for a 4-state (K=3) turbo code, the sliding window size may be chosen to be 16 bits for the benefit of, for example, VLSI implementation. The required memory is 16×4×9+1×4×9=612 bits. This is a substantial improvement over the 36,864 bits required for the global recursion approach. In addition, the performance degradation of using the sliding window approach is negligible when compared with the global recursion approach. Moreover, the latency for the sliding window approach is reduced to 3 decoding cycles instead of S decoding cycles in the global recursion approach, where S generally may be much larger than 10.

SUMMARY

In order to address the above identified and other problems of conventional turbo decoders, several memory efficient and area-efficient parallel decoding schemes are provided for turbo decoding. Through use of unique parallel decoding schemes, the increased throughput and reduced latency associated with parallel turbo decoding is maintained while the memory requirements associated with turbo decoding are reduced. In addition, several parallel decoding schemes are provided reducing the number of computation units that are required to implement a turbo decoder. Fewer computation units result in reduced power consumption for the turbo decoder (which is important for low power applications, such as, for example, wireless communications devices). Furthermore, fewer computation units result in reduced decoder complexity and better very large scale integration (VLSI) applications by reducing the area of silicon needed to implement the turbo decoder.

According to one general aspect, a parallel decoding scheme using a segmented sliding window approach may be implemented by dividing a turbo encoded data-block into sub-blocks. In addition, the data-block is divided into segments where each segment includes a number of the sub-blocks. According to the segmented sliding window approach, each segment may be decoded in parallel using the sliding window process, where each sub-block corresponds to one sliding window.

By applying the sliding window approach in parallel to the sub-blocks of each segment, the memory required to perform turbo decoder computations is substantially reduced when compared to conventional parallel turbo decoders while the benefit of latency reduction provided by parallel decoding is maintained.

According to another general aspect, several area-efficient parallel decoding schemes are provided. According to a first approach, an area-efficient parallel turbo decoding scheme may be implemented by receiving a turbo encoded block of data and dividing the data-block into sub-blocks. A pre-computation forward recursion metric is determined for a sub-block. Forward recursion metrics are determined for two or more consecutive sub-blocks following the pre-computation forward recursion metric sub-block. A pre-computation backward recursion metric is determined for another sub-block. Backward recursion metrics are determined for two or more consecutive sub-blocks preceding the pre-computation backward recursion metric sub-block. The determinations of a pre-computation forward recursion metric, forward recursion metrics, a pre-computation backward recursion metric, and backward recursion metrics are repeated to determine a forward recursion metric and a backward recursion metric for each sub-block. The data-block may be decoded based on the determined forward and backward recursion metrics. In addition, the pre-computation forward recursion metric and the pre-computation backward recursion metric for every iteration may be determined concurrently.

According to a second area-efficient approach, a turbo received encoded block of data is divided into sub-blocks. The data-block also is divided into a first segment and a second segment that overlap. For each segment in parallel the forward recursion metrics for two consecutive sub-blocks may be determined, the backward recursion metrics for the two consecutive sub-blocks, the log likelihood ration (LLR) for the two consecutive sub-blocks based on the determined forward recursion metric may be determined, and the determined backward recursion metric for the two consecutive sub-blocks may be determined. The determinations of the forward recursion metrics, the pre-computation backward recursion metric, and the backward recursion metrics may be repeated to determine the LLR for each sub-block. The data-block may be decoded based on the determined LLR.

Using either the first approach or the second approach, in addition to reducing the amount of memory required to perform the computations associated with turbo decoding, the number of computation units (e.g., units determining forward or backward recursion metrics) may be reduced. A savings of one or more computation units may be achieved depending on the level of parallelism used. Fewer computation units result in reduced decoder complexity and small chip sizes.

According to yet another general aspect, hybrid parallel decoding approaches may be used when high levels of parallelism are desired. The hybrid approach may be implemented by dividing a data-block into segments and performing a different one of the above-described approaches on different segments. For example, a data-block may be divided into three segments where the first two segments are decoded using the first area-efficient approach and the last segment is decoded using the segmented sliding window approach.

Other features and advantages will be apparent from the description, the drawings, and the claims.

DESCRIPTION OF DRAWINGS

Like reference symbols in the various drawings indicate like elements

DETAILED DESCRIPTION

Segmented Sliding Window

As discussed previously, data frames may be decoded using parallel decoding. According to one parallel decoding technique, a frame is divided into blocks and the blocks are decoded in parallel. While parallel decoding improves latency, parallel decoding suffers from the same huge memory requirement as the global recursion approach. However, by applying the concepts of the sliding window approach to parallel decoding to create a segmented sliding window approach, the benefits of reduced latency from parallel decoding may be maintained while significantly reducing the amount of memory needed to perform the decoding computations.

Figure 1:
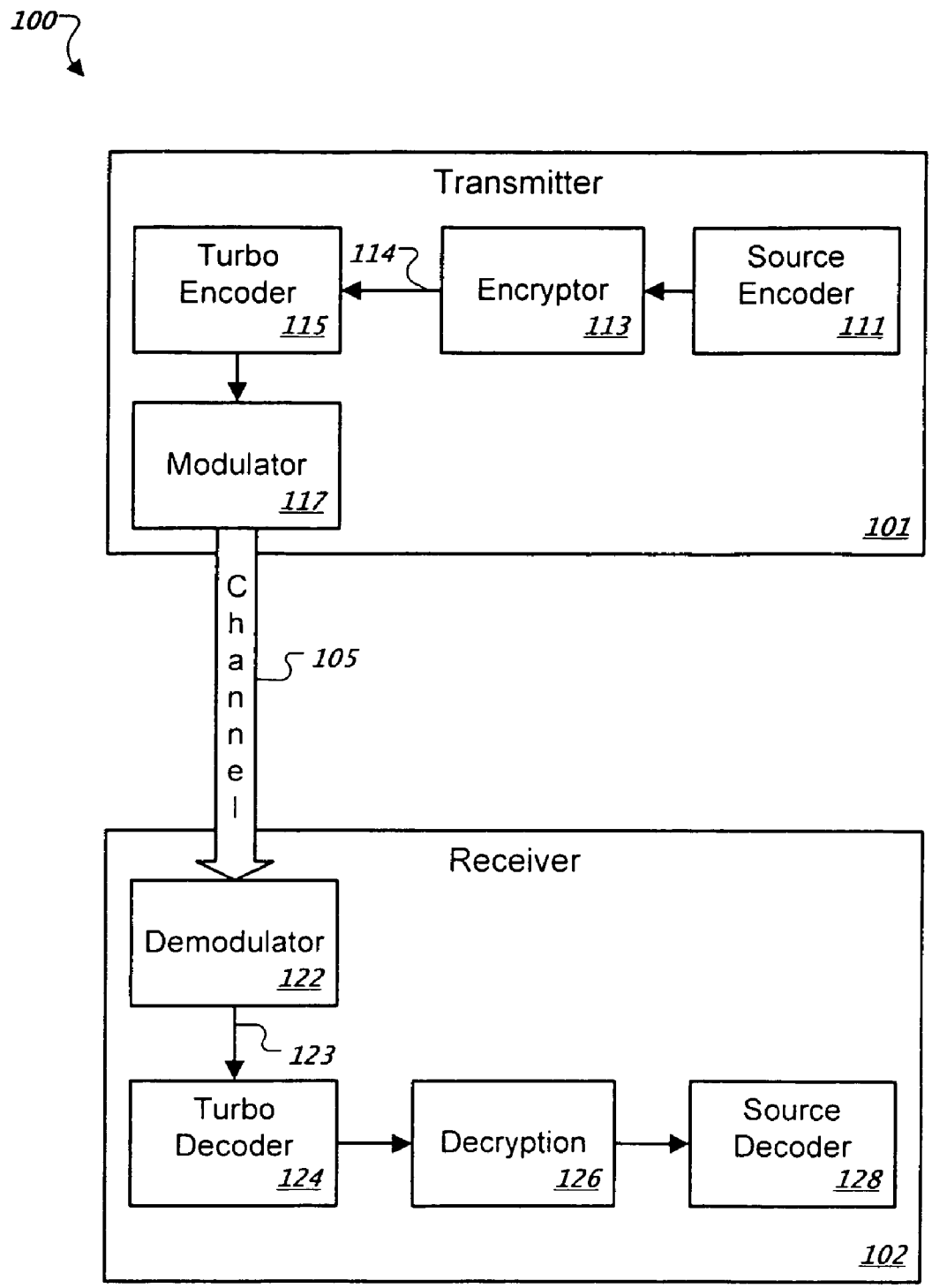
FIG. 1 is an example of a conventional communications system.
Figure 2A:
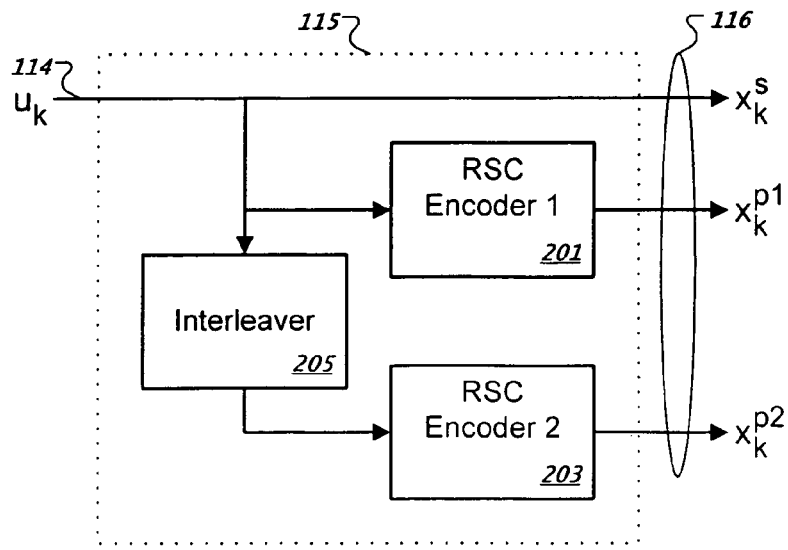
FIG. 2A is an example of a conventional turbo encoder structure for use in the system of FIG. 1.
Figure 2B:
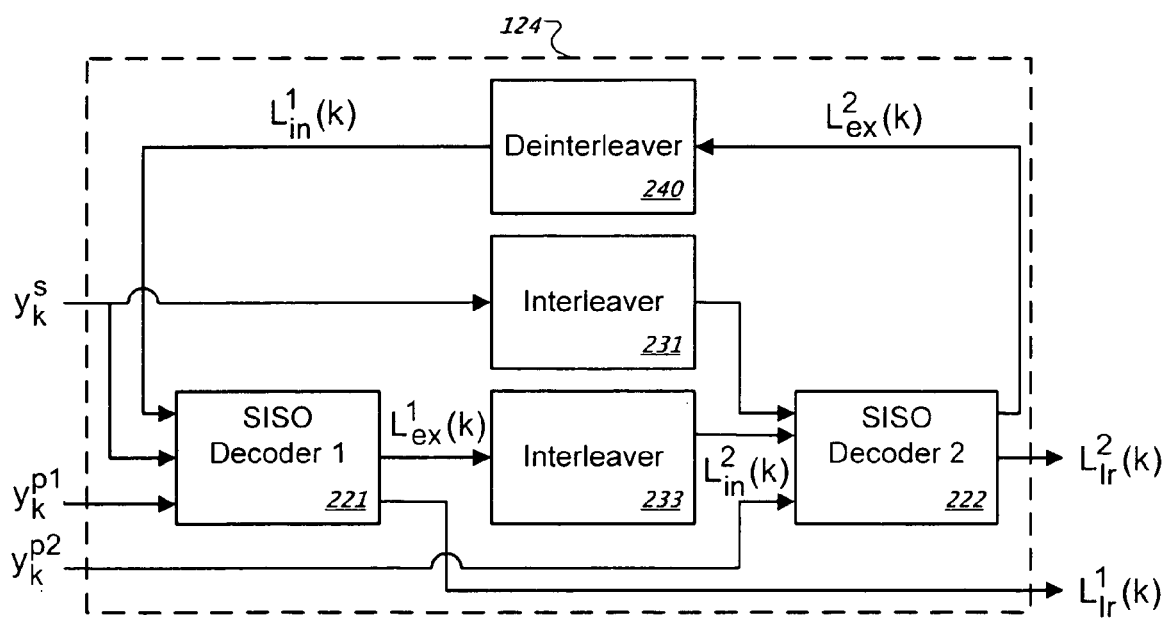
FIG. 2B is an example of conventional turbo decoder structure for use in the system of FIG. 1.
Figure 3:
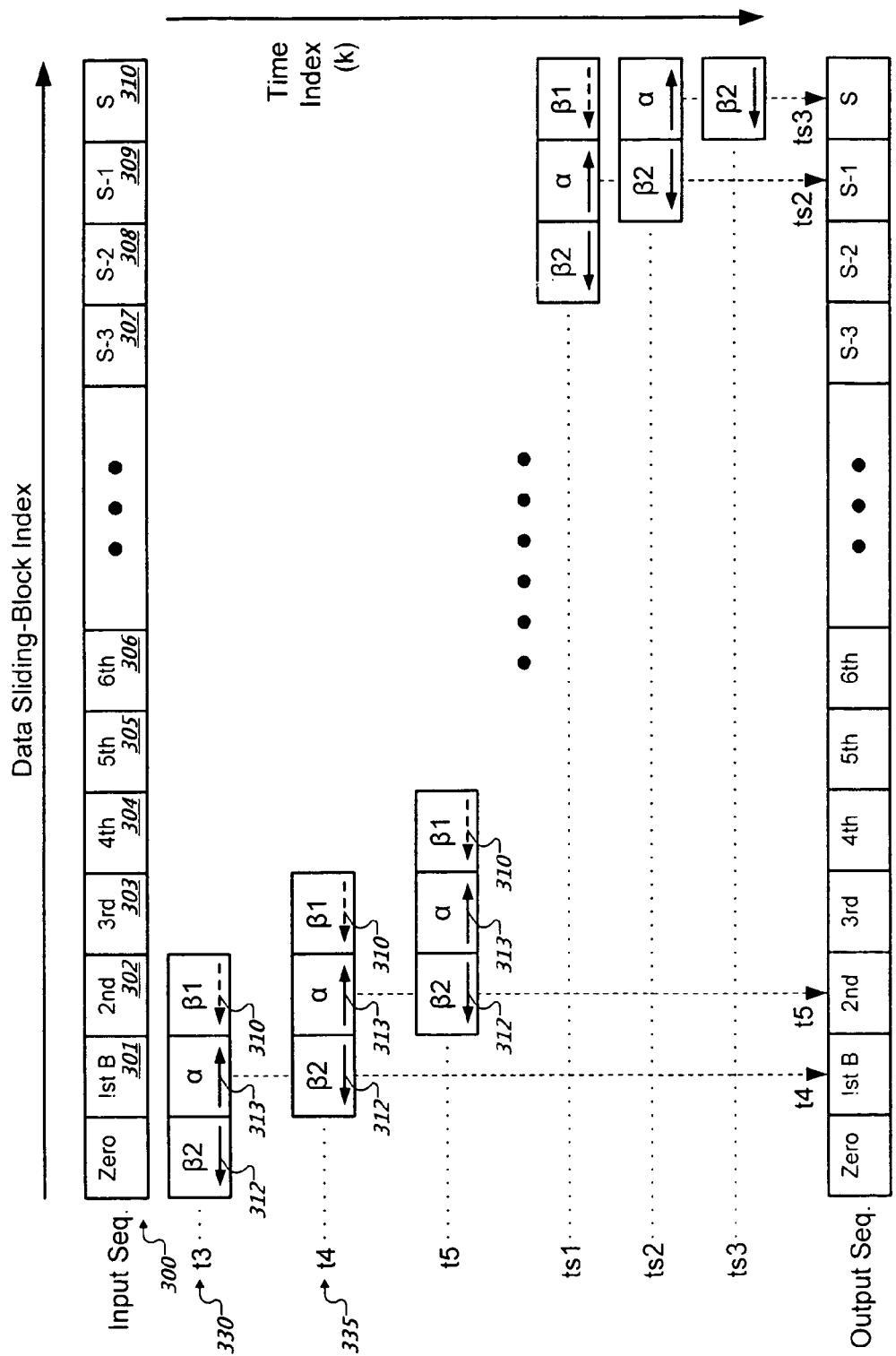
FIG. 3 is an exemplary illustration of a conventional sliding window timing diagram for turbo decoding.
Figure 4:
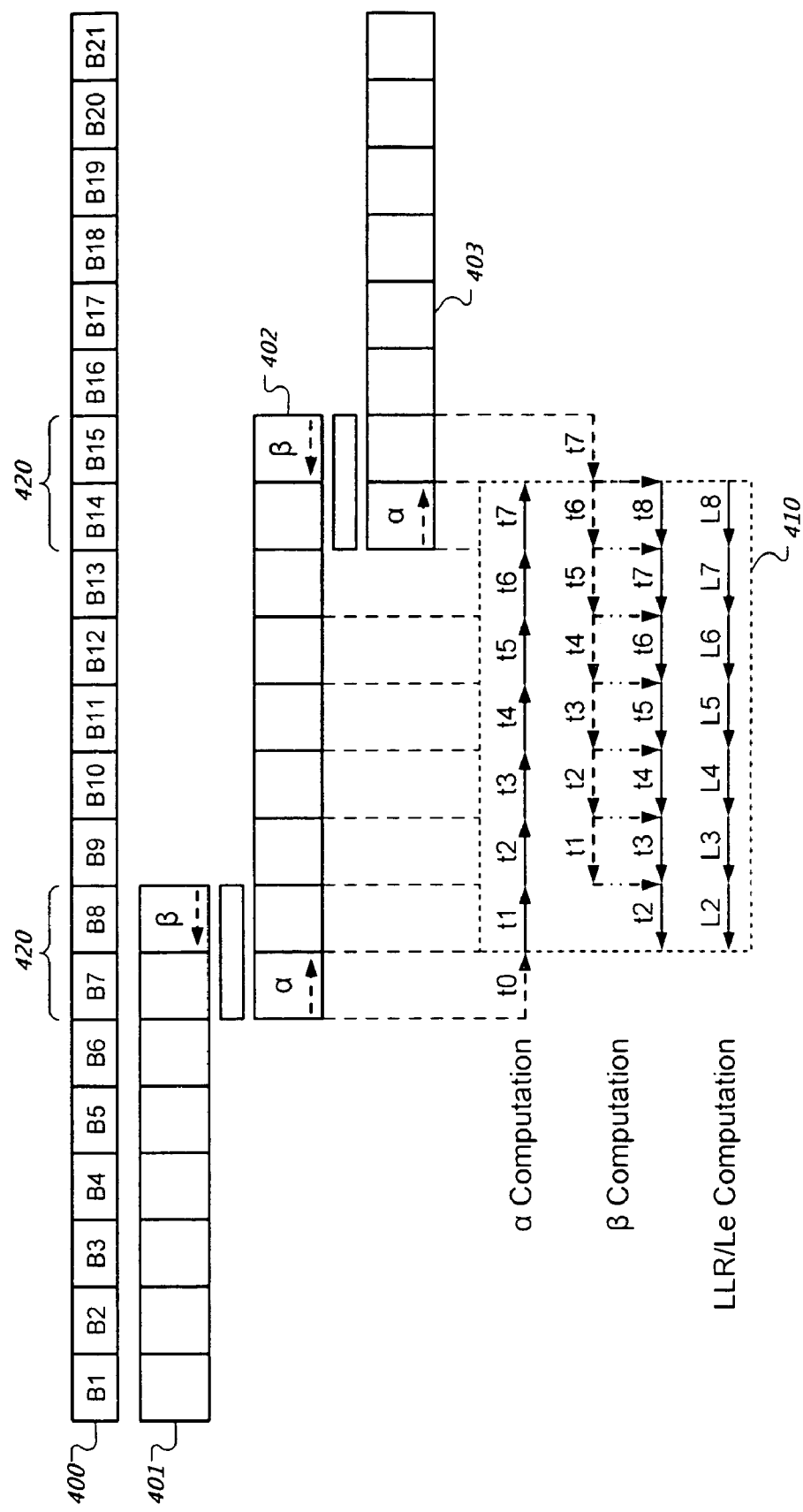
FIG. 4 is an exemplary parallel turbo decoding scheme.

Turning to FIG. 4, the segmented sliding window approach is applied to a data block 400. According to the segmented sliding window approach shown in FIG. 4, the data block 400 is divided into sub-blocks or sliding windows (B1–B21). In addition, the data block is divided into P segments (e.g., 3 segments 401, 402, 403) where P represents the level of parallelism (in this case level 3 parallelism is shown). Segment 401 decodes sub-blocks B1–B7, segment 402 decodes sub-blocks B8–B14, and segment 403 decodes sub-blocks B15–B21.

Recursion operations for forward and backward state metrics are performed in parallel on each segment using the sliding window approach for each sub-block in the segment. A timing sequence 410 for the segment 402 is shown. For example, at t2 a forward recursion metric α is determined for sub-block B9, a pre-computation backward recursion metric β1 is determined for sub-block B10, and a backward recursion metric β2, LLR, and Lex is determined for sub-block B8.

To ensure that the initial values of the recursion operations at intermediate points of a frame are reliable (e.g., the B7 of segment 401, B8 and B14 of segment 402, and B15 of segment 403), an overlap 420 is used between adjacent sub-blocks. The overlap length ensures that the starting values of the recursive computation at the either end of a segment are reliable as the starting points inside each segment. As shown in FIG. 4, where the dashed lines denote pre-computation recursion operations, the overlap depth may be chosen to be twice as long as the sliding window. As a result, when using the segmented sliding window approach, no matter how long the segment is or how many segments are used, the overlap depth between segments is suggested to be two sub-blocks or sliding windows (one sub-block for a pre-computation α and one sub-block for a pre-computation backward recursion metric β).

According to the segmented sliding window approach, if P-level parallelism is assumed, P copies of α units, 2P copies of β units and P copies of the LLR/$L_{ex}$ computation units are used. The required memory for storage of computed forward state metrics is L×P×M bits where L is the length of the sliding window and M is total number of states of one trellis stage. Assuming M=4 (i.e., K=3) and P=4, the storage of state metrics would require 16×4×4×9=2304 bits. The overall decoding time slots within one decoding phase (equals half iteration) would be (S/P+2) $T_{sw}$ where S/P is number of sliding windows within a segment.

Types of Area-Efficient Parallel Decoding Schemes

The modified parallel decoding scheme using the segmented sliding window (SSW) provides the benefits of reduced latency and memory saving. However, the SSW approach provides a ratio of "pre-computation" units to "real computation" of backward state metrics of 1:1. The ratio of real computation units to pre-computation units may be increased and higher area-efficiency (i.e., similar performance with decreased complexity or fewer number of computation units) may be obtained using area-efficient parallel decoding schemes, as described in detail below.

It is noted that once reliable backward or forward recursion state metrics have been obtained with a pre-computation unit working for a considerable number of decoding cycles, the effective recursion operations starting at this point should be continued for more decoding cycles when possible. In addition, the recursive computation of forward recursion metrics and backward recursion metrics are symmetric. As a result, forward recursion metrics may be continuously computed while computing backward recursion metrics using the sliding window approach (or a backward recursion state metric may be continuously computed while computing forward recursion state metrics using the sliding window approach), as previously described. Furthermore, the sliding window approach may be used for both forward and backward recursion operations resulting in more flexible parallel decoding schemes. In view of this, two types of parallel decoding schemes may generated according to the following the rules:

(1) the overall decoding time should not be more than S/P+2 time slots where a time slot is referred to as the period of time ($T_{sw}$) for the decoder to finish its decoding within one half iteration of a sliding window;

(2) the number of effective computation forward recursion metric unit doesn't exceed P at any time interval where P is the level of parallelism;

(3) the number of effective computation backward recursion metric units doesn't exceed P at any time interval (4) the number of LLR computation units doesn't exceed P at any time interval; and (5) the amount of memory required to store state metrics per segment should not exceed L*M symbols, where L, and M represent the sliding window length and the number of trellis states respectively.

Figure 5:
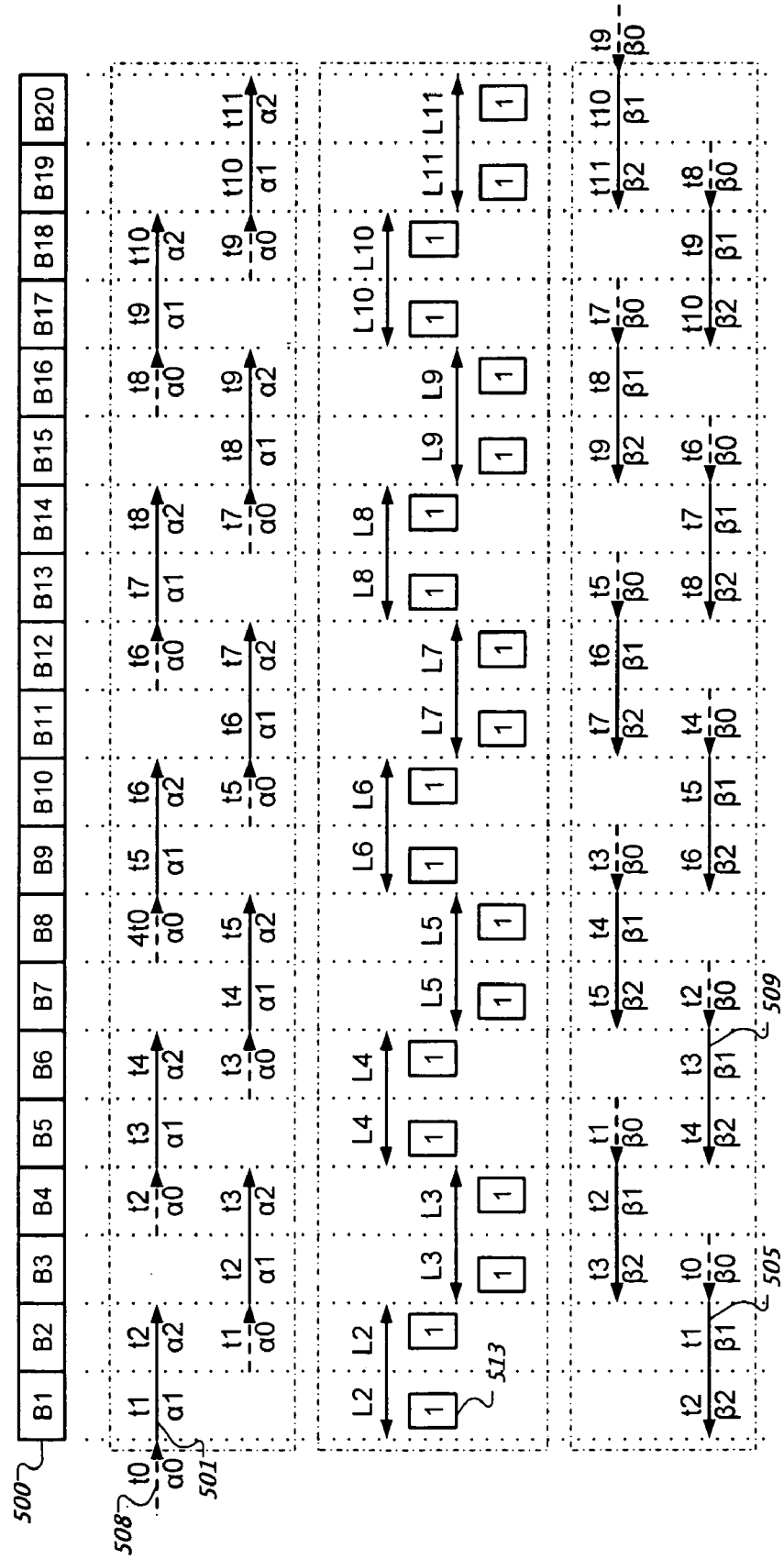
FIG. 5 is an exemplary Type-I 2-parallel turbo decoding scheme, in accordance with one embodiment of the present invention.

Turning to FIG. 5 an example of an area-efficient parallel type-I parallel decoding scheme decodes a data block or frame 500. The frame 500 is divided into a number of sub-blocks (B1–B20). According to the decoding scheme all computation units work in a pipelined fashion over the entire frame 500. As shown in FIG. 5, the right-oriented arrows 501 indicate forward recursive computations and the left-oriented arrows 505 represent backward recursion computations. The dashed lines 508 denote the pre-computation parts and solid lines 509 represent real (effective) computation parts. $L_t$ denotes performing the computation of LLR and extrinsic information during the time slot t (e.g., L2 denotes the computation of LLR and extrinsic information during time period 2). All the computation units work on the sub-blocks (shown in the top row) vertically on top of them. The small boxes 515 underneath the oriented arrows represent the memory requirement for the storage of state metrics (e.g., |1| means that state metrics within one sub-block must be saved for one time slot). In other words, memory must be provided to store the state metrics within one sliding window.

As shown in FIG. 5, at t1 a pre-computation forward recursion metric α0 is performed on sub-block B2 and a pre-computation backward recursion metric β0 is performed on sub-block B5. At t2 forward recursion computation α1 is performed on sub-block B3 and backward recursion metric β1 is performed on sub-block B4. At t3 a forward recursion metric α2 computation is performed on sub-block B4, a backward recursion metric β2 computation is performed on sub-block B3, LLRs are determined for sub-blocks B3 and B4. Similar computations are carried out over the entire frame 500. In addition, although the computations are shown starting with B1 the computations could start at the end B20 and work across the frame 500 in reverse.

Using the type-I 2-parallel approach, three α units (α0, α1, and α2), three β units (β0, β1, and β2), and two LLR computation units are needed. The overall decoding cycles and computation units for the type I 2-parallel scheme (8 units) is the same as the 2-parallel SSW approach (8 units). However, the type-I approach has a benefit that it does not require the entire data frame at the beginning of iterative decoding. In addition, the ratio of real computation units to pre-computation units is increased to 2:1. At parallelism P>2, the type-I approach also reduces the number of computation units over the SSW approach, as shown in further detail below.

Figure 6:
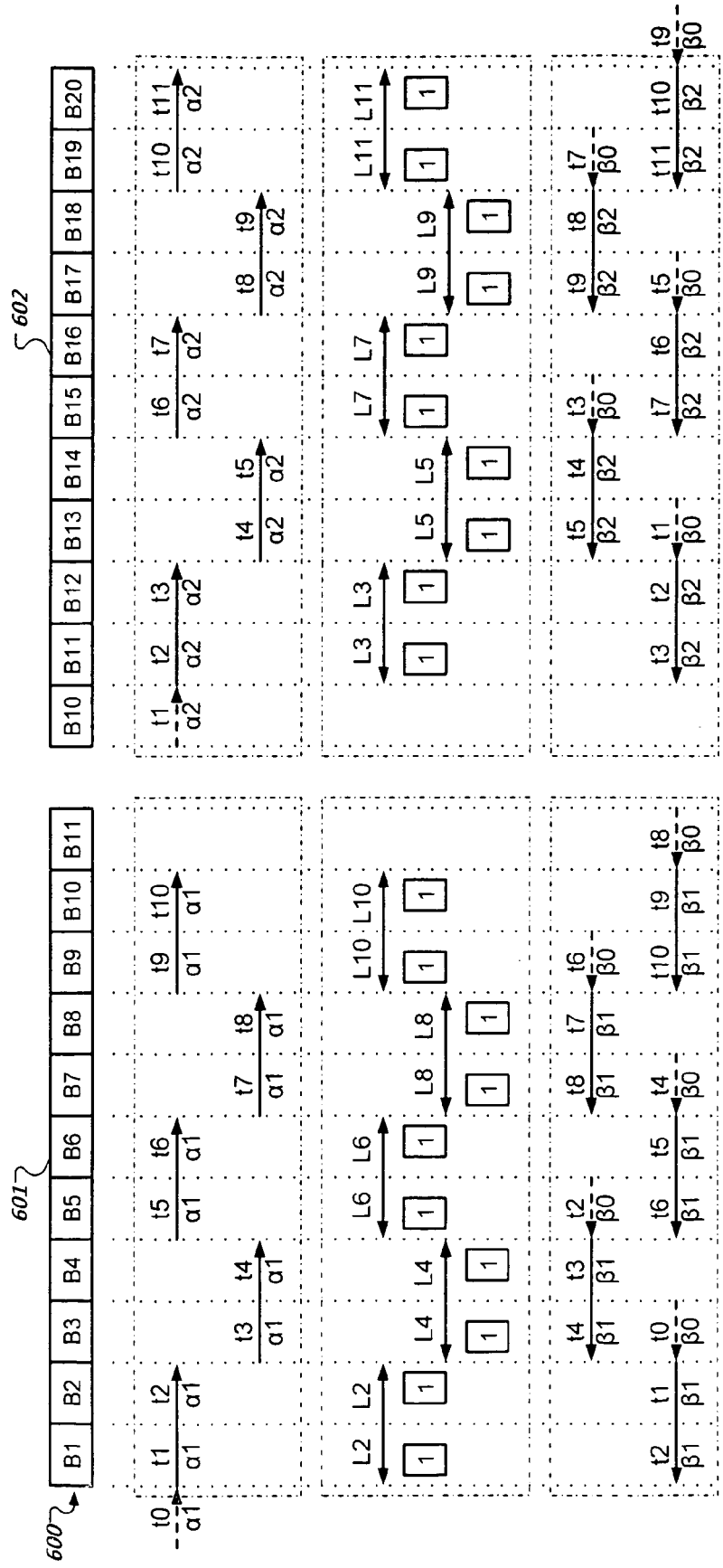
FIG. 6 is an exemplary Type-II a-parallel turbo decoding scheme, in accordance with one embodiment of the present invention.

As shown in FIG. 6, an example of a type-II parallel decoding scheme for a 2-parallel case includes a frame 600 that is divided into two segments 601 and 602. Each segment consists of a S/P+1 sliding windows or sub-blocks. The segments 601 and 602 overlap by two sub-blocks (i.e., B10 and B11). All computation units work in a pipelined way over each segment instead of over the entire frame (as described with regard to FIG. 5).

For the type II 2-parallel decoding scheme, two α units (α1 and α2), three β units (β0, β1, and β2) and two LLL/$L_{ex}$ computation units are required. The label (e.g., t1) over the oriented arrow represents the time slot in which the computation unit (under the oriented arrow, e.g., al) is processing.

Compared with the SSW approach, type II 2-parallel procedure uses one less β unit and the memory requirement and overall latency are exactly the same. In addition, on the average, the backward recursion state metrics computed using the type-II scheme are more reliable than those computed using the SSW approach because the average recursion depth (of backward recursion computation) of the type II scheme is larger.

Although the type-II parallel decoding scheme is superior to the type-I scheme in the case of 2-level parallelism, the type II parallel decoding scheme may not be suitable for higher level (e.g., P>2) parallel implementations for one or more of the following reasons: the total number of computation units may not be minimized, the requirement for storage of state metrics may not be minimized, and the overall decoding cycles may not be minimized.

Figure 7:
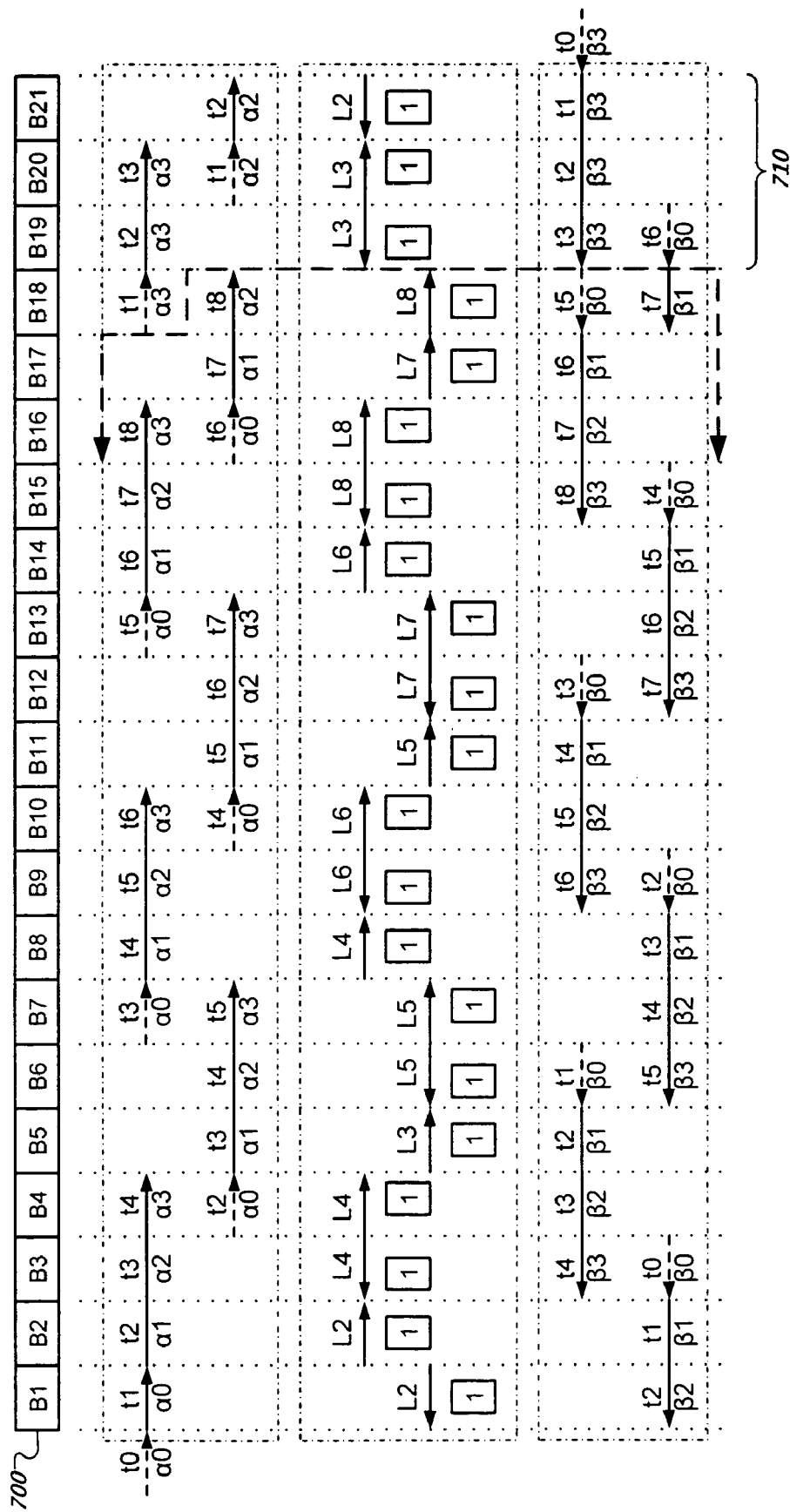
FIG. 7 is an exemplary Type-I 3-parallel turbo decoding scheme, in accordance with one embodiment of the present invention.

The timing diagram for a 3-level type-I parallel decoding scheme is shown in FIG. 7. All symbols in the diagram have the meanings described above with regard to FIG. 5. Note, as shown in FIG. 7, the number of computation units working across a frame 700 may not perfectly coincide with the end of a frame 700. However, computation units may be optimally assigned to maximize efficiency. For example, beginning at the start of the frame 700 the forward recursion metric α3 would (in an unmodified approach) not make it first computation unit time slot t4. Therefore, the decoding may be optimized by having α3 begin computations on the remained portion 710 for the first three time slots (t1–t3). The same may be done with backward recursion metric unit β3. If we make a small change, put the right hand side (RHS) three columns to the left side and shift the left hand side (LHS) 17 columns to the right side, this 3-level type-I parallel architecture will maintain the original benefit of not requiring the whole frame is received before the decoding starts. The timing control (when and which sub-block to process) is taken care by the control circuitry.

Using the area-efficient procedure of FIG. 7, 4α computation units, 4β units and 3 LLL/$L_{ex}$ computation units are used. The state metrics are required to store as many as three sliding windows. In general, the required overall decoding cycles are S/3+2. When compared with the SWW, the new approach requires an additional α unit, but saves two β units. As there is no difference in VLSI implementation between α and β units, the net saving for the new approach is an additional computation unit (α or β). The latency and memory requirement for both approaches are exactly the same.

Figure 8:
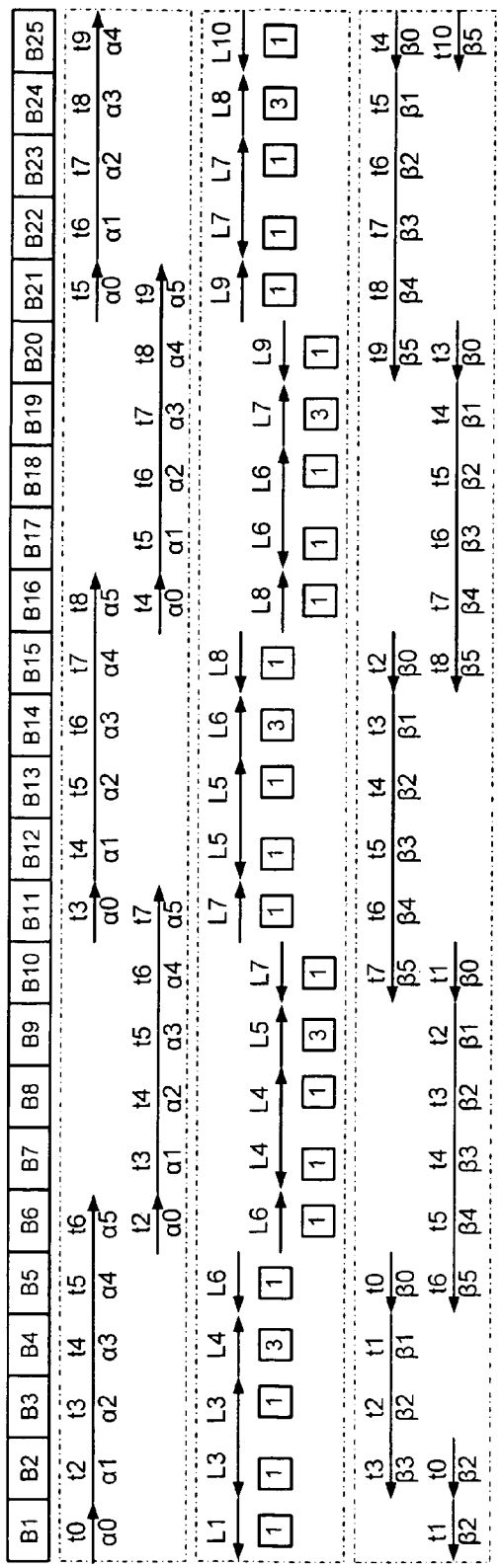
FIG. 8 is an exemplary Type-I 5-parallel turbo decoding scheme, in accordance with one embodiment of the present invention.
Figure 8:
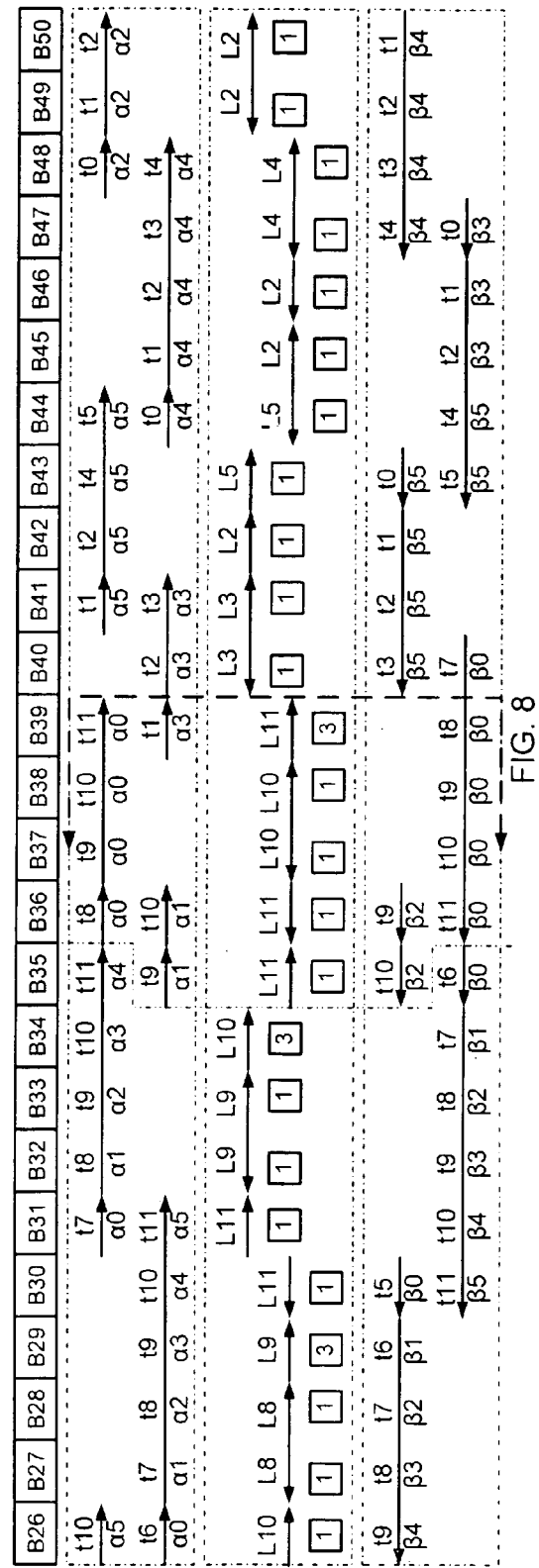

When P>3, the type-I parallel decoding scheme may not be optimal. FIG. 8 shows an example of a 5-parallel decoding scheme using 6α units, 6β units and 5 LLL/$L_{ex}$ computation units. The overall decoding cycles are S/5+2=50/5+2=12. When compared with the SSW approach, this decoding scheme has a net savings of 3α units. The latency is the same. However, the storage of state metrics for 7 instead of 5 sliding windows is used. As a result, the new scheme stores the state metrics of an additional two sliding windows over the SSW approach.

Figure 9:
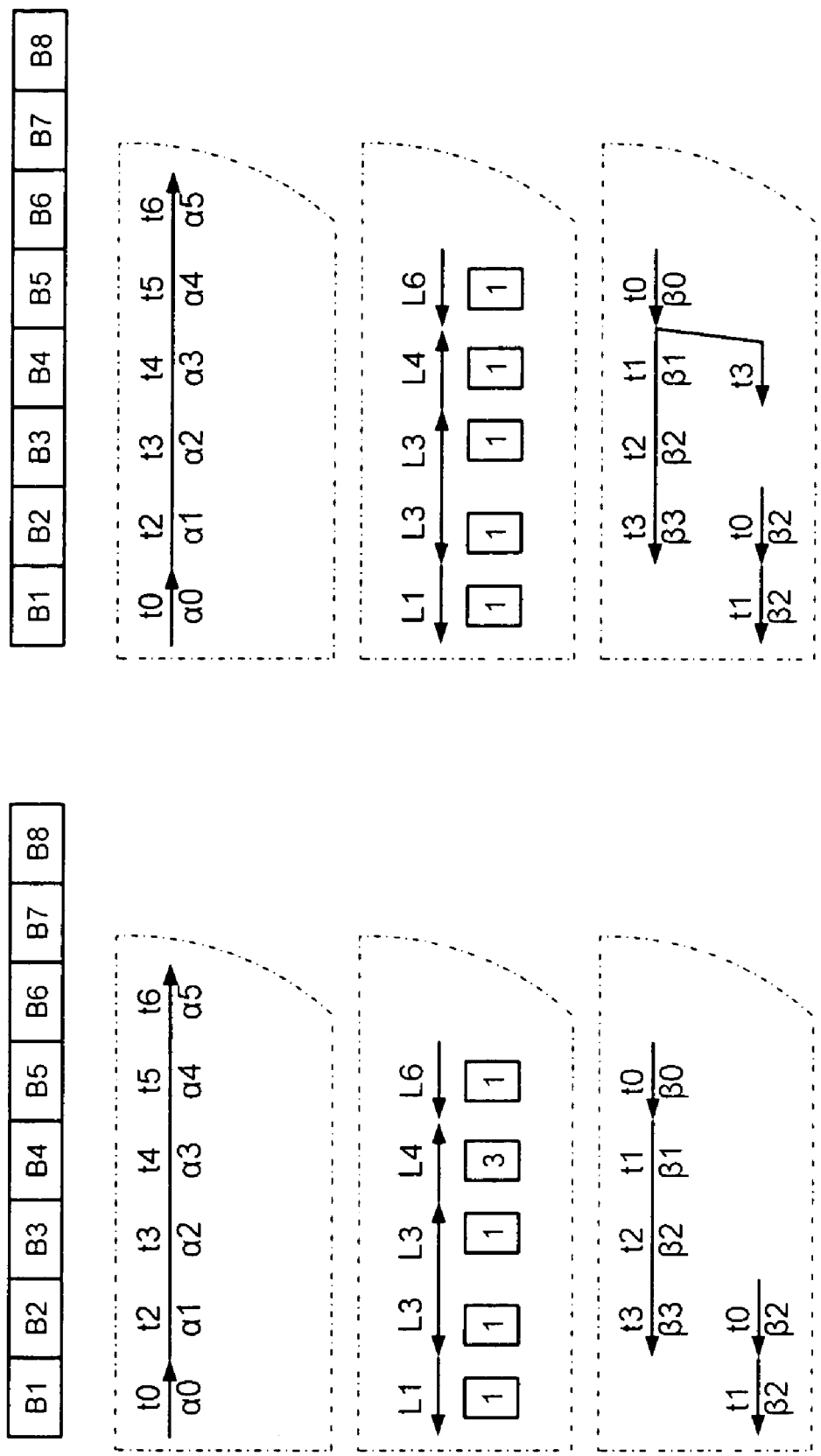
FIG. 9 illustrates an exemplary trade-off for parallel decoding schemes, in accordance with one embodiment of the present invention.

There are at least two ways to trade offs to the saving of computation units for the additional storage of state metrics. Using a first procedure, only the starting values of the state metrics are saved for those cases in which the computation of α and β differs in time for more than 1 time index. An extra β computation unit is used to recompute the backward recursion state metrics during the time period with just one time index difference from the computation time of forward state metrics. An example is shown in FIG. 9, where the thick solid line represents the re-computation part. Using this procedure, two computation units are saved with a similar storage requirement and latency to the SSW approach.

Hybrid Parallel Decoding Schemes

If a very high level parallelism is desired, hybrid parallel decoding schemes may be used instead of the direct implementation of the type-I or type-II parallel decoding schemes. A hybrid parallel decoding scheme combines one or more of the previously described SSW, Type I, or Type II approaches. For example, if a 4-parallel decoding scheme is used, a frame may be divided into two segments and then the type-II 2-parallel decoding scheme may be applied to each segment. Using this procedure, two computation units may be saved as compared with the SSW procedure.

If a 5-parallel decoding scheme is required, either the type-I parallel decoding approach combined with the trade-off method described above or a hybrid parallel decoding scheme may be used. Using a hybrid parallel decoding scheme, a frame is divided into two segments, e.g., part A and part B, with a reasonable overlap depth. The ratio of the overall number of sliding blocks for the two parts (excluding the overlap part) are chosen as 2:3. Then the type-II 2-parallel decoding scheme is used for part A and the type-I 3-parallel decoding scheme is employed for part B that results in two saved computation units. The overall saving of computation units is one less than the type-I 5-parallel decoding scheme while the latter requires an additional storage of state metrics for 2 sliding windows.

If a 6-level parallelism is used, a frame may be divided into three equal-length segments. The type-II 2-parallel decoding scheme may be applied to each segment resulting in an overall net savings of three computation units. This decoding scheme is better than applying the type-I 3-parallel decoding scheme onto two equivalent segments. For P>6 cases, hybrid decoding schemes can be constructed similarly as described above. For optimal savings, the type-II decoding scheme should be applied when possible.

Performance Comparison

Figure 10:
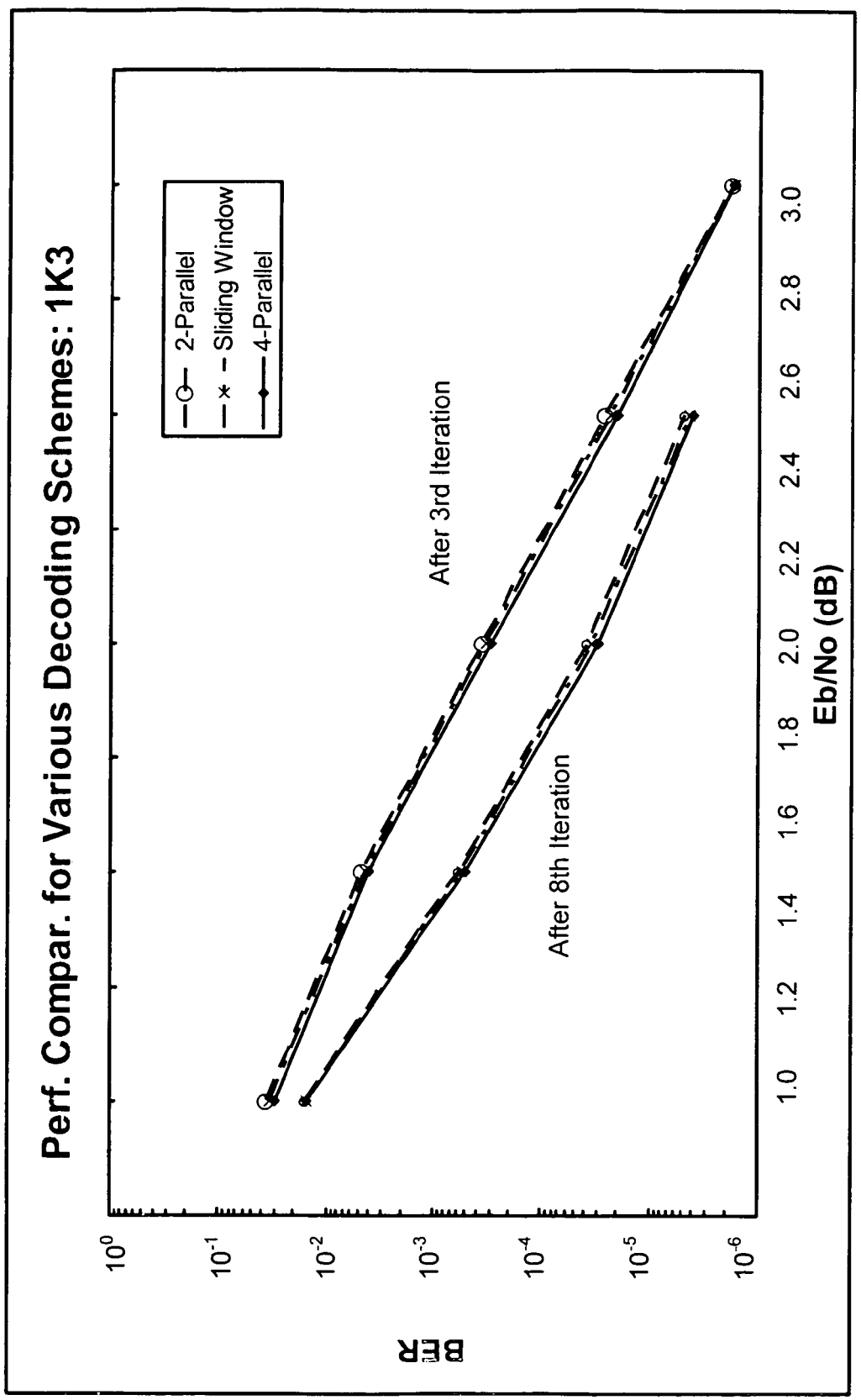
FIGS. 10 and 11 illustrate a performance comparison of various decoding schemes, in accordance with one embodiment of the present invention.
Figure 11:
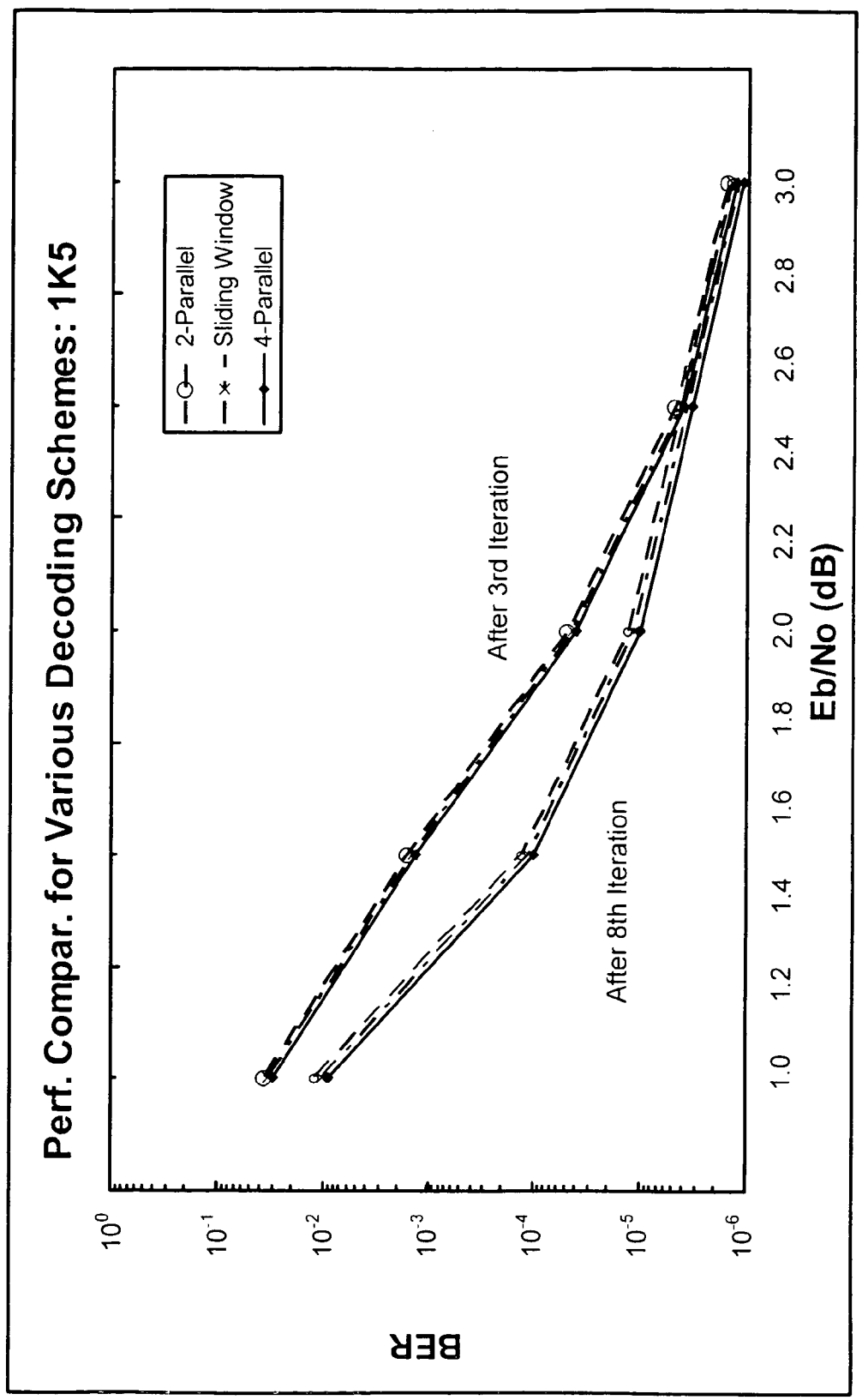

Simulations for the 1K3 and 1K5 cases were performed assuming an additive white gaussian noise (AWGN) channel with binary phase shift key (BPSK) modulation. A code rate of r=½ was chosen for a frame size of N=1024 bits. Random interleaved turbo encoding was used. 1K3 indicates a constraint length (defined as the memory size of the constituent RSC encoder plus one) of K=3 and 1K5 indicates a constraint length of 5. The simulation results shown in FIG. 10 and FIG. 11 correspond to the 1K3 case and 1K5 case, respectively. 20 million random information bits were generated in each case and turbo decoding was performed under $E_b/N_o$<3.0 dB. FIG. 10 and FIG. 11 show performance comparisons for three different parallel decoding schemes. The dashed line represents the type-I 2-parallel decoding scheme. The dash-dot line represents the sliding window approach with global recursion. The solid lines represent the type-I 4-parallel decoding scheme. It is observed that there exists negligible difference in the performance among these three decoding schemes. The performance of Type I 2-parallel parallel decoding scheme is slightly worse in general than the case of the sliding window approach. The performance of 4-parallel decoding scheme is a little bit better in general than the case of the sliding window approach. As can be seen from the figures, the performance of pipelined parallel decoding schemes are at least as good as the sliding window procedure when the level of parallelism is no less than 3. However, the area efficient parallel decoding schemes have greater throughput than the sliding window approach and use fewer computation units and memory units than conventional parallel decoding approaches.

Turbo Decoder Architecture

Figure 12A:
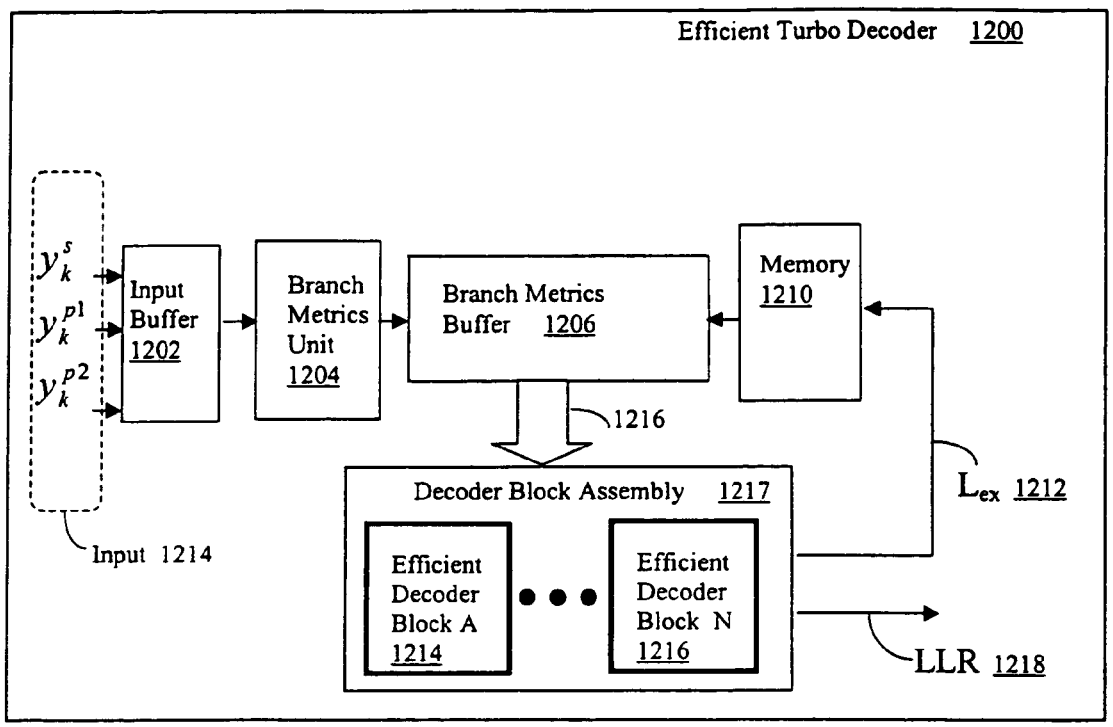
FIG. 12A is a block diagram of an efficient turbo decoder, in accordance with one embodiment of the present invention.

Referring now to FIG. 12A, a block diagram of an efficient turbo decoder is shown, in accordance with one embodiment of the present invention. Efficient turbo decoder 1200 illustrates one embodiment for replacing turbo decoder 124 in a conventional communication system 100, with an improved turbo decoder that saves power and may use fewer components.

Efficient turbo decoder 1200 includes an input buffer 1202 that receives input 1214, branch metrics unit 1204, branch metrics buffer 1206, and decoder block assembly 1217, that produces output LLR 1218, all electrically coupled to each other in series in the present embodiment. A memory block 1210 is coupled to decoder block assembly 1217 and to branch metrics unit 1204 as a feedback loop to return decoded result information back, i.e., $L_{ex}$ 1212, for calculations in branch metrics unit 1204. Memory block 1210 is utilized to accommodate different output and input data rates and timing requirements of the system. This feedback loop is known to those skilled in the art.

Input buffer 1202 includes memory and control circuitry, known to those skilled in the art, for managing and storing data inputs 1214, e.g., for data bits $y_k^s$, $y_k^{p1}$, and $y_k^{p2}$, in relation to the data needs of the balance of the efficient turbo decoder block 1200. Branch metrics unit 1204 includes hardware and/or software for implementing algorithms to calculate measurements, or metrics, for state changes of data input 1214, as know by those skilled in the art. Branch metrics buffer 1206 provides a buffer between the output of branch metrics unit 1204 and decoder block assembly 1217, to accommodate their variations in data output results and data input needs, respectively.

Decoder block assembly 1217 includes at least one efficient decoder block, e.g., Block-1 1214, and may include up to a quantity of N decoder blocks, e.g., block-N 1219. In the present embodiment, at least a single decoder block is utilized, e.g., Block-1 1214, with no other decoder blocks, e.g., N=0. In another embodiment, a total of two decoder blocks are utilized, e.g., Block-1 1214 and Block-N, where N=2. The actual value of N for a given application depends upon the application itself and its system requirements, performance goals, etc. For example, if a data block is segmented into a quantity of N segments, then in one embodiment, each of N independent decoder blocks can be applied to on of N segments to accomplish parallel processing of the data block. Subsequent figures provide details and description of multiple alternative embodiments for efficient decoder block.

The choice of the architecture embodiment for each of the efficient decoder blocks, Block-1 1214 through Block-N 1219, similarly depends upon details of the given application and its system requirements, performance goals, etc. For example, system variables to be accommodated include data block size, latency goals, error rate goals, etc. The present invention is well suited to a wide range of applications and performances. In one embodiment, only one efficient decoder block is utilized in decoder block assembly 1217, and it utilizes a Type I decoder architecture.

In another embodiment, multiple decoder blocks are utilized in decoder block assembly 1217, both with type II decoder architectures. In yet another embodiment, a hybrid approach of combining different types of efficient decoder blocks within decoder block assembly is utilized. In this latter embodiment, efficient decoder block A 1214 implements a type I decoder architecture while block N 1219 implements a type II decoder architecture. This combination of different types of decoder architecture is possible because of the quasi-independence of the decoder blocks from each other.

The choice of architecture utilized for a decoder block can depend upon the length of data blocks and other variables to capitalize on the strengths of the different architectures. However, as with any system, the performances, timing, data rates, etc. between components must be coordinated in the ASIC design using appropriate control logic, buffers, etc. By providing this kind of flexibility, the present invention allows a wide range of combinations of quantities of decoder blocks, types of architecture, and types of algorithmic solutions to be utilized for turbo decoding.

Figure 12B:
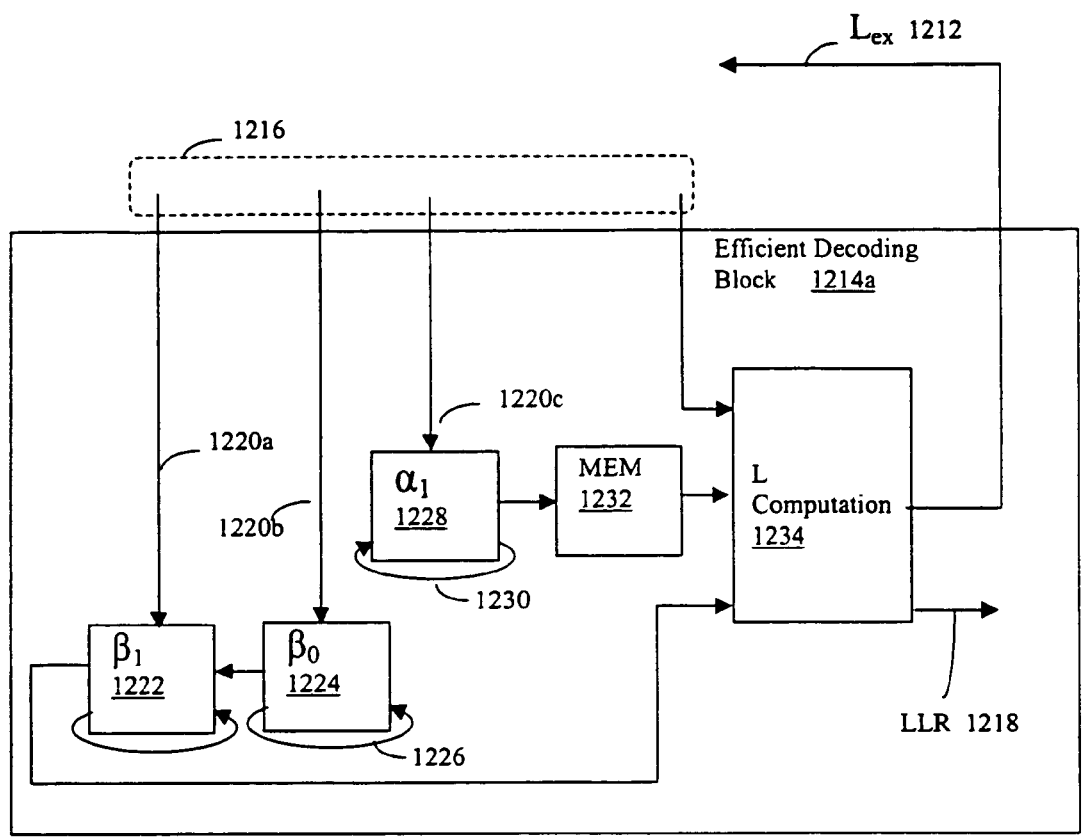
FIG. 12B is a block diagram of an efficient decoding block for use in the efficient turbo decoder of FIG. 12A, in accordance with one embodiment of the present invention.

Referring now to FIG. 12B, a block diagram of an efficient decoding block for use in the efficient turbo decoder of FIG. 12A, in accordance with one embodiment of the present invention. Efficient decoding block 1214a (baseline decoding block) provides one embodiment of decoder block 1214 in FIG. 12A. In the present embodiment, at least two efficient decoder blocks 1214a are used in decoder block assembly 1217 of FIG. 12A when the architecture of decoding block 1214a of the present figure is utilized. For example, in one embodiment, each of three baseline decoding block 1214a are utilized to parallely process one of three segments, e.g., segments 401, 402, and 403 of a data block 400 as shown in FIG. 4.

Efficient decoding block 1214a includes two pipelined beta ($\beta$) computation units 1224 and 1222 coupled in series, and a single alpha ($\alpha$) computation unit 1228 in the present embodiment. Input data lines 1216 (shown as bus in FIG. 12A) are coupled to a unit 1228 as shown by arrow 1220c and $\beta$ units 1222 and 1224 as shown by arrows 1220a and 1220b, respectively, to receive input data. The $\beta_0$ unit 1224 acts as the pre-computation unit for the backwards recursion metric calculation. The $\alpha$ unit 1228 output is coupled to memory 1232, which is then coupled to L computation unit 1234. Memory 1232 accommodates processing delays per the decoding algorithm between $\alpha$ unit 1228 and $\beta$ unit 1222. The $\beta$ unit 1222 has an output line coupled to L computation unit 1234.

These computation units can be referred to as computation units, in general, as they perform the same recursive algorithmic computation on data, shown as exemplary return loop 1226 on $\beta_0$ unit 1224 and exemplary return loop 1230 for $\alpha$ unit 1228. That is, the computation unit performs X cycles of recursive computations on data for a time period $T_{sw}$, referred to as a time slot, before spitting out the data to the next device, e.g., another computation unit or memory. The distinguishing characteristic between a $\beta$ units and an $\alpha$ unit is the sequencing of data that it is fed, e.g., $\beta$ unit processes data chronology backward while an $\alpha$ unit processes data chronologically forward. The components of a computation unit are known to those skilled in the art and can vary depending on the algorithm implemented therein.

L computation unit 1234 performs algorithmic calculations known as log likelihood ratio LLR and extrinsic information $L_{ex}$, described hereinabove. $L_{ex}$ output line 1212 is fed back to memory 1210 as shown in FIG. 12A. L computation unit 1234 includes devices for computing the algorithmic computation of LLR and $L_{ex}$ as known to those skilled in the art.

Figure 12C:
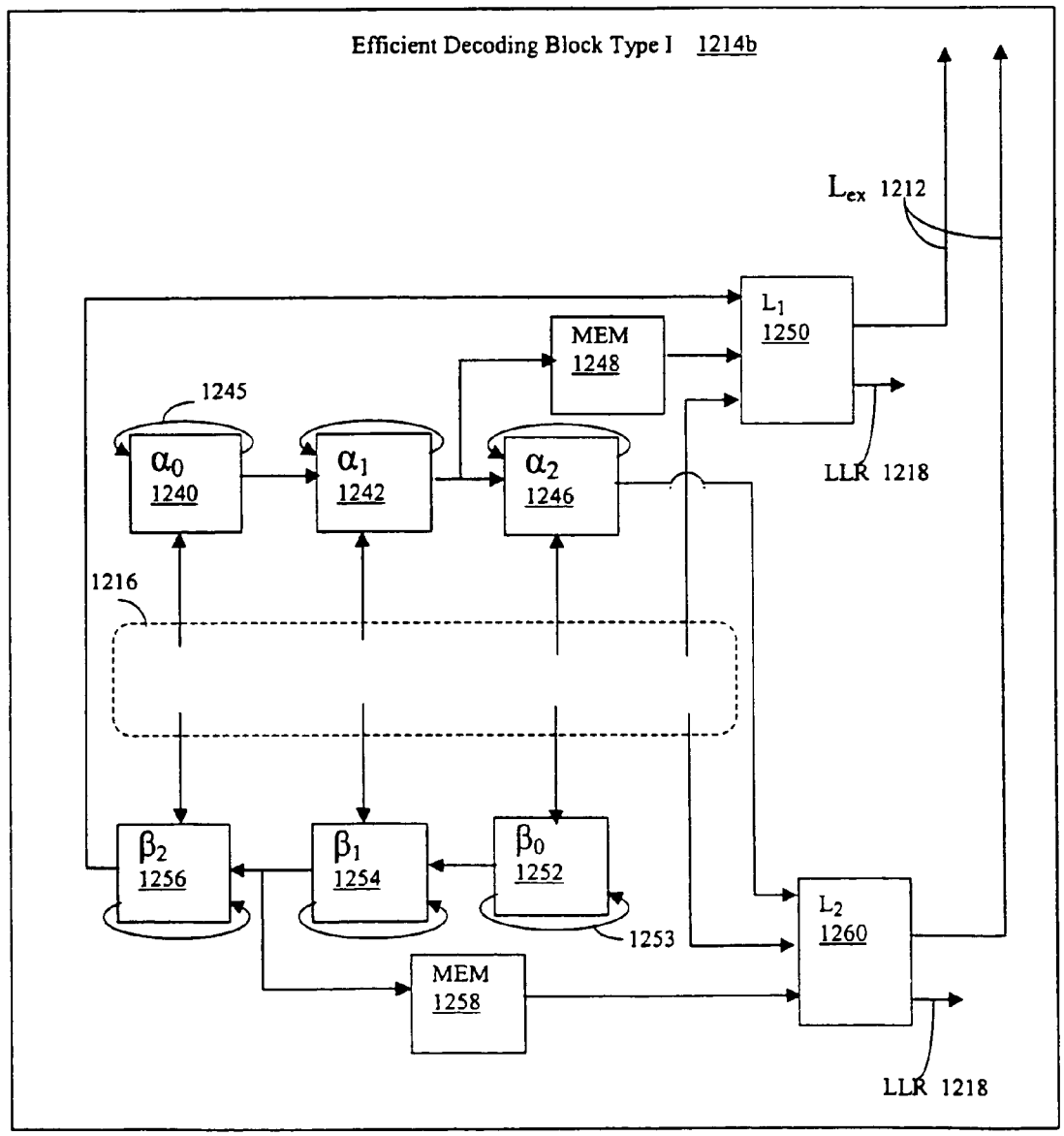
FIG. 12C is a block diagram of a Type I efficient decoding block for use in the efficient turbo decoder of FIG. 12A, in accordance with one embodiment of the present invention.

Referring now to FIG. 12C, a block diagram of a Type I efficient decoding block, for use in the efficient turbo decoder of FIG. 12A, is shown in accordance with one embodiment of the present invention. Efficient decoding block 1214b provides one embodiment of decoder block 1214 in FIG. 12A. In the present embodiment, one or more efficient decoder block(s) 1214b can be used in decoder block assembly 1217 of FIG. 12A.

Efficient decoding block 1214a is designed for a 2 parallel case, whose algorithm and implementation is illustrated in FIG. 5. While the 2 parallel case for Type I architecture does not save computation units compared to a parallel implementation of a baseline decoding block, e.g. as shown in FIG. 12B, a 3 parallel case of Type I architecture does save one computation unit in comparison to the baseline decoding block implementation. A 3 parallel case of Type I architecture would add a third $\alpha$ unit coupled in series to the $\alpha_2$ unit 1246 and would add a third $\beta$ unit coupled in series to $\beta_2$ unit 1256. An output from the third $\alpha$ unit and the third $\beta$ unit would be coupled to a third L computation unit, the output from the third $\beta$ unit first going to a third memory block (none of the third units are shown in the present figure). The branch metrics line 1216 would also be coupled to the third L computation unit. The present invention is well suited to a wide range of parallelism cases. However for sake of clarity, only the 2 parallel case of Type I architecture is shown herein. One skilled in the art can easily apply the architecture shown in FIG. 12C to an M-parallel case embodiment, where M$\geq$3. A 3 parallel case for Type I architecture implementation is illustrated in FIG. 5; while a 5 parallel case Type I architecture implementation is shown in FIG. 8.

Efficient decoding block 1214b includes three pipelined beta ($\beta$) computation units 1252, 1254, 1256 coupled in series, and three alpha ($\alpha$) computation unit 1240, 1242, 1246 coupled in series in the present embodiment. Input data lines 1216 (shown as bus in FIG. 12A) are coupled to each $\alpha$ unit 1240, 1242, and 1246 and to each $\beta$ unit 1252, 1254, and 1256 to receive input data. The $\alpha$1 unit 1242 output is coupled to memory 1248, that is in-turn coupled to L1 computation unit 1250. Memory 1248 accommodates processing delays per the decoding algorithm between $\alpha$1 unit 1242 and $\beta$2 unit 1256. Similarly, $\beta$1 unit 1254 output is coupled to memory 1258, which is in turn coupled to $L_2$ computation unit 1260.

Still referring to FIG. 12C, the two parallelism case for type I architecture arises because two L computation units, 1250 and 1260, are supported by parallely tapping data from the set of $\alpha$ a unit $\beta$ units at different locations in the pipeline architecture. Consequently, the present invention capitalizes on previously calculated data from upstream computation units. The description of computation units and L computation unit from the previous figures applies to the present figure. $L_1$ an 1250 and $L_2$ 1260 computation units each receive branch metric data from data lines 1216 and provide independent output on data lines 1212 that are coupled to memory 1210 shown in FIG. 12A.

Figure 12D:
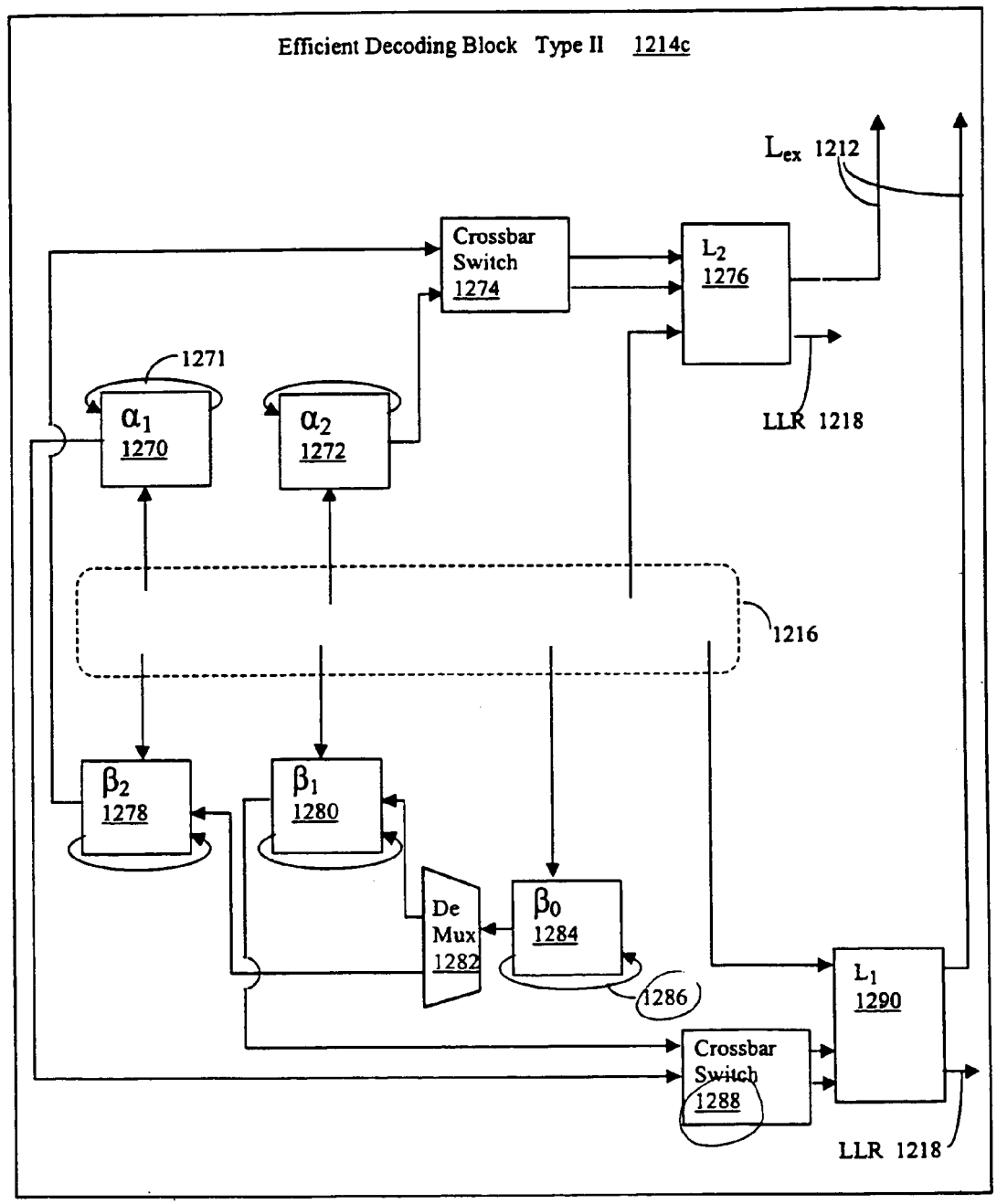
FIG. 12D is a block diagram of a Type II efficient decoding block for use in the efficient turbo decoder of FIG. 12A, in accordance with one embodiment of the present invention.

Referring now to FIG. 12D, a block diagram of a Type II efficient decoding block, for use in the efficient turbo decoder of FIG. 12A, is shown in accordance with one embodiment of the present invention. Efficient decoding block 1214c provides one embodiment of decoder block 1214 in FIG. 12A. In the present embodiment, one or more efficient decoder block(s) 1214b can be used in decoder block assembly 1217 of FIG. 12A.

Efficient decoding block 1214c is designed for a 2 parallel case, whose algorithm and implementation is illustrated in FIG. 6. The present invention is well suited to a wide range of parallelism cases. However for sake of clarity, only the 2 parallel case of Type II architecture is shown herein. One skilled in the art can easily apply the architecture shown in FIG. 12D to an M-parallel case embodiment, where M≧3.

While the 2-parallel case of the Type I turbo decoding scheme is illustrated in FIG. 12C, the present invention is well suited to different quantities of parallelism. For example, in one embodiment, a 3-parallel case of the Type I turbo decoding scheme may be used. While the architecture is similar to that shown in FIG. 12C, additional α and β units would be need for the 3-parallel case. In particular, this embodiment would utilize the coupling arrangement between $\alpha_0$, $\alpha_1$, and $\alpha_2$ as shown in FIG. 12C. However, it would include an $\alpha_3$ unit that is coupled to $\alpha_2$. Similarly, the 3-parallel case would utilize the coupling arrangement between $\beta_0$, $\beta_1$, and $\beta_2$ as shown in FIG. 12C. However, it would include a $\beta_3$ unit coupled to $\beta_2$.

The outputs of the α and β units would be different as well. For example, the outputs would be coupled to satisfy the timing requirements shown in FIG. 7 for the 3-parallel case. In particular, the output from β1 would be coupled to a memory block and the output from the memory block would be coupled to a first L unit that also would receive the output from $\alpha_1$ and the branch metrics. Similarly, the output from $\beta_2$ would be coupled to a memory block and the output from the memory block would be coupled to a second L unit that would receive the output from $\alpha_3$ and the branch metrics. Finally, the output from $\alpha_2$ would be coupled to a memory block and the output from the memory block would be coupled to a third L unit that would receive the output from $\beta_3$ and the branch metrics. The outputs from the L units would operate similarly to those discussed in FIG. 12C. The present embodiment is just one example of the many different ways that computation units may be arranged and timed to satisfy the timing chart shown in FIG. 7.

While previous FIG. 12C utilized a pipeline approach among coupled β units and among coupled α units, the present embodiment utilizes more independent computation units. Efficient decoding block 1214c includes three beta (β) computation units 1284, 1280, and 1278. $\beta_0$ pre-computation unit 1284 (having return loop 1286) is coupled to demux 1282 that in turn is coupled to $\beta_1$ unit 1280 and $\beta_2$ unit 1280. IN this manner, $\beta_0$ pre-computation unit 1284, that is not needed every cycle, can be shared alternating between the two β units, e.g., units 1280 and 1278. Consequently, the present embodiment saves one computation unit over a baseline decoding block, as shown in FIG. 12B, and over a conventional replication of SISO units for a 2 parallel case. More computation units are saved with higher parallelism cases.

Efficient decoding block 1214c only includes two alpha (α) computation units 1270 and 1272, in the present embodiment, that are coupled to crossbar switches 1274 and 1248, respectively. Crossbar switches 1274 and 1288 provide a function of receiving an input from an α and a β unit, storing one of them in memory and transmitting the other one. Thus, at one instance, output metrics from an α unit are stored in memory of a crossbar switch and metrics from a β unit are communicated to an L computation unit. In another instance, the same crossbar switch would store output metrics from a β unit and communicate output metrics from a α unit to the L computation unit. The decision on which metrics to store and which to communicate depends on the timing diagram shown in FIG. 6. The crossbar switch may be implemented via parallely-coupled multiplexers and a memory, the inputs of the crossbar switch may be provided to any of the outputs that are then provided to the L computation units, e.g. $L_2$ 1276 and $L_1$ 1290, respectively. Input data lines 1216 (shown as bus in FIG. 12A) are coupled to each α unit 1270 and 1272, to each β unit 1278, 1280, and 1284, and to each L computation unit, 1276, and 1290 to receive branch metric input data.

Still referring to FIG. 12D, the two parallelism case for type II architecture arises because two sets of α unit β units are designated for a given segment of a data block. For example, the first set is the $\alpha_1$ unit 1270 and $\beta_1$ unit 1280 that supply data to $L_1$ computation block 1290. Similarly, the second set is the $\alpha_2$ unit 1272 and $\beta_2$ unit 1278 that supply data to $L_2$ computation block 1276. Each L computation blocks 1276 and 1290 provides an output LLR 1216, for subsequent processing in the communication system. Each L computation blocks 1276 and 1290 also provides an output extrinsic information $L_{ex}$ 1212 that is fed back to memory 1210 as shown in FIG. 12A.

While the present embodiments illustrated in FIGS. 12B through 12D utilizes hardware to accomplish the turbo decoding algorithms, the processes and steps of the present invention can also be implemented using a combination of hardware and software, e.g., programmable logic device (PLD), co-processor, a digital signal processor (DSP), etc. whose construction and operation are known to those skilled in the art. The data lines used in the present embodiment for coupling components in FIGS. 12B through 12D are typically busses for accommodating multiple data transfers, although a different coupling medium may be used in another embodiment.

The turbo decoders and decoding schemes described above may be implemented in a wide variety of digital spread-spectrum wireless communication systems or techniques that utilize code sequences. For example, code sequences are utilized in wireless communications for many functions including, but not limited to: filtering, searching, modulation, and demodulation. The systems or techniques which utilize code sequences include, but are not limited to, fixed wireless, unlicensed Federal Communications Commission (FCC) wireless systems, wireless local area network (W-LAN), cordless telephony, cellular telephony, personal base station, telemetry, and other digital data processing applications. In addition, the coding/decoding schemes may be applied to transmitters, such as, for example, a base station, and to receivers, such as, for example, a terminal, for fixed wireless, W-LAN, cellular telephony, and personal base station applications.

A number of implementations have been described. Nevertheless, it will be understood that various modifications may be made. For example, advantageous results may be achieved if steps of the disclosed techniques are performed in a different order and/or if components in the disclosed systems are combined in a different manner and/or replaced or supplemented by other components. Accordingly, other implementations are within the scope of the following claims.

What is claimed is:

1. A method, performed by a receiver device, of decoding a received communication signal comprising turbo encoded data, the method comprising:
    receiving a signal comprising a turbo encoded block of data;
    dividing the turbo encoded block of data into contiguous sub-blocks of data;
    dividing the turbo encoded block of data into contiguous and partially overlapping segments, each segment including a number of contiguous sub-blocks and including at least one sub-block also included in each adjacent segment; and producing decoded output data by decoding each of the segments in parallel using a sliding window process, wherein, for each of the segments being decoded in parallel, the sliding window process is successively performed on consecutive ones of sub-blocks included in the respective segment, and is performed using a sliding window of a size that is equal to a size of the sub-block on which the sliding window process is being performed.

2. The method of claim 1 wherein the sliding window process includes determining a forward recursion metric for a sub-block during one time period $T_i$ and determining a backward recursion metric for the sub-block during a following time period $T_{i+1}$.

3. The method of claim 2 wherein the sliding window process includes determining a log likelihood ratio (LLR) for the sub-block based on the determined forward recursion metric and the determined backward recursion metric for the sub-block.

4. The method of claim 1 wherein a forward recursion metric, a backward recursion metric, and a log likelihood ratio (LLR) are determined for each sub-block of each segment using the sliding window process.

5. The method of claim 1 wherein the data-block is divided into segments that overlap any adjacent segment or segments by two sliding windows.

6. The method of claim 1 wherein the sliding window process comprises determining a forward recursion metric for a sub-block during time period $T_i$, determining a backward recursion metric for the sub-block during a following time period $T_{i+1}$, and determining a log likelihood ratio (LLR) during time period $T_{i+1}$ from the forward recursion metric determined during time period $T_i$, and the backward recursion metric determined during time period $T_{i+1}$.

7. The method of claim 6 further comprising determining a pre-computation backward recursion metric for the sub-block during time period $T_{i-1}$.

8. The method of claim 6 further comprising determining a pre-computation backward recursion metric for a sub-block following the sub-block during time period $T_i$, wherein the determined pre-computation backward recursion metric is used to determine the backward recursion metric during time period $T_{i+1}$ for the sub-block.

9. A turbo decoder comprising:
an interface to receive a signal comprising a turbo encoded block of data; and
a decoder to divide the turbo encoded block of data into contiguous sub-blocks of data and segments, each segment including a number of contiguous sub-blocks and including at least one sub-block also included in each adjacent segment, the decoder including:
a parallel processor to decode each of the segments in parallel using a sliding window process, wherein, for each of the segments being decoded in parallel, the sliding window process is successively performed on consecutive ones of sub-blocks included in the respective segment, and is performed using a sliding window of a size that is equal to a size of the sub-block on which the sliding window process is being performed.

10. The turbo decoder of claim 9 wherein the parallel processor determines a forward recursion metric for a sub-block during time period $T_i$ and determines a backward recursion metric for the sub-block during the following time period $T_{i+1}$.

11. The turbo decoder of claim 10 wherein the parallel processor determines a log likelihood ratio (LLR) for the sub-block based on the determined forward recursion metric and the determined backward recursion metric for the sub-block.

12. The turbo decoder of claim 9 wherein the parallel processor determines a forward recursion metric, a backward recursion metric, and a log likelihood ratio (LLR) for each sub-block of each segment using the sliding window process.

13. The turbo decoder of claim 9 wherein the decoder divides the data-block into segments that overlap any adjacent segment or segments by two sliding windows.

14. The turbo decoder of claim 9 wherein the parallel processor determines a forward recursion metric for a sub-block during time period $T_i$, determines a backward recursion metric for the sub-block during time period $T_{i+1}$, and determines a log likelihood ratio (LLR) during time period $T_{i+1}$ from the forward recursion metric determined during time period $T_i$ and the backward recursion metric determined during time period $T_{i+1}$.

15. The turbo decoder of claim 14 wherein the parallel processor determines a pre-computation backward recursion metric for the sub-block during time period $T_{i-1}$.

16. The turbo decoder of claim 14 wherein the parallel processor determines a pre-computation backward recursion metric for a sub-block following the sub-block during time period $T_i$ and the determined pre-computation backward recursion metric is used to determine the backward recursion metric during time period $T_{i+1}$ for the sub-block.

* * * * *

UNITED STATES PATENT AND TRADEMARK OFFICE
CERTIFICATE OF CORRECTION

PATENT NO.         : 7,200,799 B2                                   Page 1 of 1
APPLICATION NO.    : 10/134684
DATED              : April 3, 2007
INVENTOR(S)        : Zhongfeng Wang It is certified that error appears in the above-identified patent and that said Letters Patent is hereby corrected as shown below:

Column 17, line 33, please delete "$T_i$," and insert --$T_i$-- therefor.

Signed and Sealed this

Seventeenth Day of March, 2009

JOHN DOLL
*Acting Director of the United States Patent and Trademark Office*